US012587139B2

(12) United States Patent (10) Patent No.: US 12,587,139 B2

Mourant (45) Date of Patent: Mar. 24, 2026

(54) ENHANCED CURRENT MIRROR FOR MULTIPLE SUPPLY VOLTAGES

(71) Applicant: MACOM Technology Solutions Holdings, Inc., Lowell, MA (US)

(72) Inventor: Jean-Marc Mourant, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 18/405,323

(22) Filed: Jan. 5, 2024

(65) Prior Publication Data

US 2024/0146247 A1 May 2, 2024

Related U.S. Application Data

(63) Continuation of application No. 17/495,924, filed on Oct. 7, 2021, now Pat. No. 11,909,359.

(51) Int. Cl.
*H03F 1/02* (2006.01)
*H03F 3/04* (2006.01)

(52) U.S. Cl.
CPC ............. *H03F 1/0211* (2013.01); *H03F 3/04* (2013.01)

(58) Field of Classification Search
CPC .......... H03F 1/0211; H03F 3/04; H03F 1/523; H03F 1/301; G05F 3/262
USPC ......................................... 330/285, 296, 289
See application file for complete search history.

(56) References Cited

U.S. PATENT DOCUMENTS

| | | | |
|---|---|---|---|
| 5,793,194 A * | 8/1998 | Lewis | H03F 1/301 |
| | | | 323/315 |
| 6,008,673 A | 12/1999 | Glass et al. | |
| 6,133,764 A | 10/2000 | Griffith et al. | |
| 7,626,427 B2 | 12/2009 | Gruber et al. | |
| 8,598,914 B2 | 12/2013 | Nishijima et al. | |
| 9,225,298 B2 | 12/2015 | Ripley et al. | |
| 9,407,207 B2 | 8/2016 | Tsutsui et al. | |
| 10,290,279 B2 | 5/2019 | Shiibayashi | |
| 10,461,629 B2 | 10/2019 | Rommel et al. | |
| 11,114,880 B2 | 9/2021 | Kondo | |

(Continued)

OTHER PUBLICATIONS

European Search Report for corresponding European Patent Application No. 22199688.7, mailed Feb. 23, 2023.

(Continued)

*Primary Examiner* — Hieu P Nguyen

(74) *Attorney, Agent, or Firm* — Sheridan Ross P.C.

(57) ABSTRACT

An enhanced current mirror can be utilized to accurately control a bias current associated with an amplifier. A current controller component (CCC) can employ the enhanced current mirror and can be associated with the amplifier. The CCC can comprise a comparator that can compare an adjusted supply voltage level to a reference voltage level, the adjusted supply voltage level relating to a supply voltage level of a supply voltage supplied to the amplifier and CCC. The CCC can control switching of an operational state of a transistor of the comparator to switch in or out a resistance of a reference resistor component associated with the supply voltage, based on a result of the comparison of the adjusted supply voltage level to the reference voltage level, to facilitate accurately controlling an amount of bias current associated with the amplifier. The CCC and amplifier can be situated on the same die.

20 Claims, 7 Drawing Sheets

(56)                    References Cited

U.S. PATENT DOCUMENTS 11,137,783 B2    10/2021  Liang
2023/0116579 A1     4/2023  Mourant

OTHER PUBLICATIONS

Office Action for U.S. Appl. No. 17/495,924, mailed Dec. 20, 2022.
Notice of Allowance for U.S. Appl. No. 17/495,924, mailed Apr. 24, 2023.
Notice of Allowance for U.S. Appl. No. 17/495,924, mailed Oct. 30, 2023.

* cited by examiner

100

VOLTAGE SUPPLY COMPONENT 104

CURRENT CONTROLLER COMPONENT 106

REFERENCE RESISTOR COMPONENT 108

FIRST REFERENCE RESISTOR SUB-COMPONENT 114

SECOND REFERENCE RESISTOR SUB-COMPONENT 116

AMPLIFIER COMPONENT 102

OUTPUT

GROUND 118 or Vss 120

COMPARATOR COMPONENT 112

GROUND 118

VOLTAGE ADJUSTER COMPONENT 110

GROUND 118 or Vss 120

Figure 6:
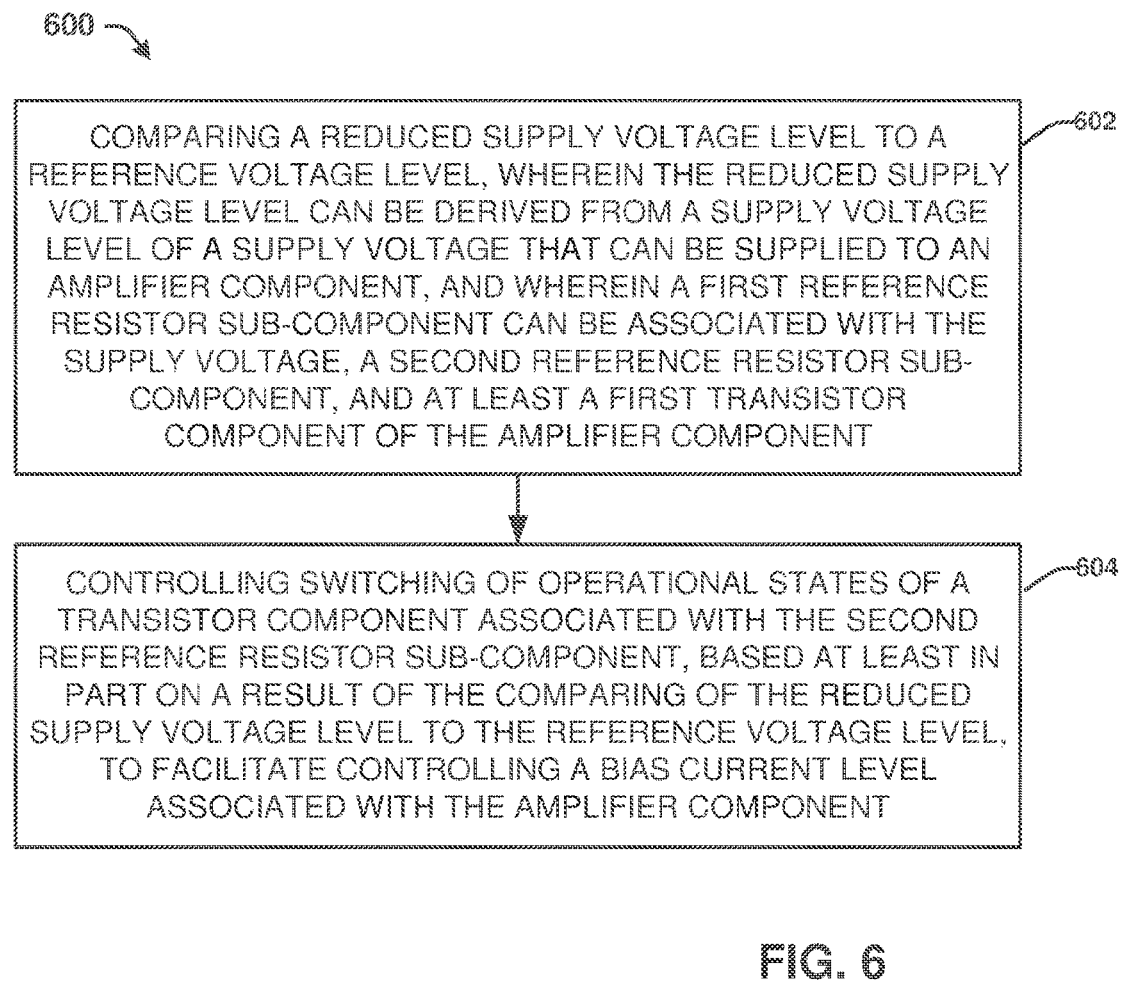

600 —↘

602

COMPARING A REDUCED SUPPLY VOLTAGE LEVEL TO A REFERENCE VOLTAGE LEVEL, WHEREIN THE REDUCED SUPPLY VOLTAGE LEVEL CAN BE DERIVED FROM A SUPPLY VOLTAGE LEVEL OF A SUPPLY VOLTAGE THAT CAN BE SUPPLIED TO AN AMPLIFIER COMPONENT, AND WHEREIN A FIRST REFERENCE RESISTOR SUB-COMPONENT CAN BE ASSOCIATED WITH THE SUPPLY VOLTAGE, A SECOND REFERENCE RESISTOR SUB-COMPONENT, AND AT LEAST A FIRST TRANSISTOR COMPONENT OF THE AMPLIFIER COMPONENT

604

CONTROLLING SWITCHING OF OPERATIONAL STATES OF A TRANSISTOR COMPONENT ASSOCIATED WITH THE SECOND REFERENCE RESISTOR SUB-COMPONENT, BASED AT LEAST IN PART ON A RESULT OF THE COMPARING OF THE REDUCED SUPPLY VOLTAGE LEVEL TO THE REFERENCE VOLTAGE LEVEL, TO FACILITATE CONTROLLING A BIAS CURRENT LEVEL ASSOCIATED WITH THE AMPLIFIER COMPONENT

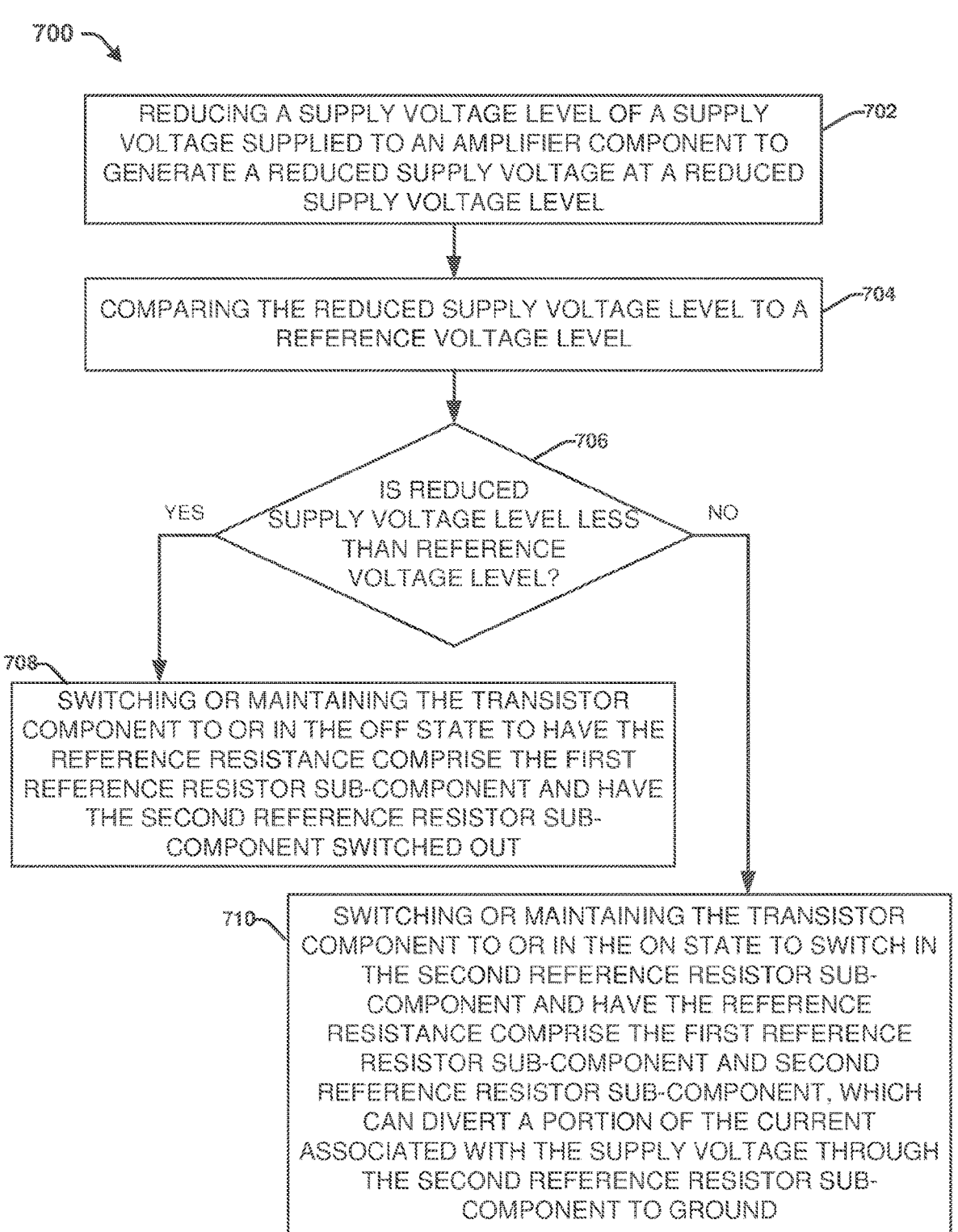

REDUCING A SUPPLY VOLTAGE LEVEL OF A SUPPLY VOLTAGE SUPPLIED TO AN AMPLIFIER COMPONENT TO GENERATE A REDUCED SUPPLY VOLTAGE AT A REDUCED SUPPLY VOLTAGE LEVEL —702

COMPARING THE REDUCED SUPPLY VOLTAGE LEVEL TO A REFERENCE VOLTAGE LEVEL —704

—706
IS REDUCED SUPPLY VOLTAGE LEVEL LESS THAN REFERENCE VOLTAGE LEVEL?

YES     NO

708—
SWITCHING OR MAINTAINING THE TRANSISTOR COMPONENT TO OR IN THE OFF STATE TO HAVE THE REFERENCE RESISTANCE COMPRISE THE FIRST REFERENCE RESISTOR SUB-COMPONENT AND HAVE THE SECOND REFERENCE RESISTOR SUB-COMPONENT SWITCHED OUT

710—
SWITCHING OR MAINTAINING THE TRANSISTOR COMPONENT TO OR IN THE ON STATE TO SWITCH IN THE SECOND REFERENCE RESISTOR SUB-COMPONENT AND HAVE THE REFERENCE RESISTANCE COMPRISE THE FIRST REFERENCE RESISTOR SUB-COMPONENT AND SECOND REFERENCE RESISTOR SUB-COMPONENT, WHICH CAN DIVERT A PORTION OF THE CURRENT ASSOCIATED WITH THE SUPPLY VOLTAGE THROUGH THE SECOND REFERENCE RESISTOR SUB-COMPONENT TO GROUND

FIG. 7

ENHANCED CURRENT MIRROR FOR MULTIPLE SUPPLY VOLTAGES

CROSS-REFERENCE TO RELATED APPLICATIONS

This application is a Continuation of U.S. patent application Ser. No. 17/495,924, filed Oct. 7, 2021. The entire contents of which are incorporated herein by reference in their entirety.

TECHNICAL FIELD

The subject disclosure relates generally to electronic circuitry, e.g., to an enhanced current mirror for multiple supply voltages.

BACKGROUND

Amplifiers and products containing amplifiers can be used by different users (e.g., consumers) in different applications. The supply voltage available for an amplifier product in an electronic device also can vary. For example, a Gallium Arsenide (GaAs) pseudomorphic high-electron-mobility transistor (pHEMT) amplifier may be designed for a 6 volt (V) supply, but, depending on the electronic device in which the amplifier is used, the amplifier may be used with a 5V or 8V supply. In amplifier products (and certain other types of products), it can be desirable to have voltage supply independent current biasing. However, the differences in supply voltages provided by different types of voltage supply components and differences in amplifier designs, which can use different supply voltages (which can be different from the voltage supplied by a voltage supply component), can present various challenges with regard to achieving desirable (e.g., accurate and efficient) voltage supply independent current biasing.

The above-described description is merely intended to provide a contextual overview relating to current technology and is not intended to be exhaustive.

SUMMARY

The following presents a simplified summary in order to provide a basic understanding of some aspects described herein. This summary is not an extensive overview of the disclosed subject matter. It is intended to neither identify key or critical elements of the disclosure nor delineate the scope thereof. Its sole purpose is to present some concepts in a simplified form as a prelude to the more detailed description that is presented later.

In some embodiments, the disclosed subject matter can comprise a device that can comprise a comparator component that compares an adjusted supply voltage level to a reference voltage level, wherein the adjusted supply voltage level relates to a supply voltage level of a supply voltage that is supplied to an amplifier component. The device also can comprise a current controller component that controls a resistance of a reference resistor component associated with the supply voltage, based on a result of the comparison of the adjusted supply voltage level to the reference voltage level, to facilitate controlling an amount of bias current associated with the amplifier component.

In certain embodiments, the disclosed subject matter can comprise a system that can include a comparator component that compares a modified supply voltage level to a reference voltage level, wherein the modified supply voltage level is based on a supply voltage level of a supply voltage that is provided to an amplifier component. The system also can comprise a current controller component that manages a resistance of a reference resistor component associated with the supply voltage, based on a result of the comparison of the modified supply voltage level to the reference voltage level, to facilitate managing a reference current level associated with the amplifier component.

In still other embodiments, the disclosed subject matter can comprise a method that can comprise comparing a reduced supply voltage level to a reference voltage level, wherein the reduced supply voltage level is derived from a supply voltage level of a supply voltage that is supplied to an amplifier component, wherein a reference resistor component comprises a first reference resistor sub-component and a second reference resistor sub-component, and wherein the first reference resistor sub-component is associated with the supply voltage, the second reference resistor sub-component, and a first transistor component of the amplifier component. The method also can comprise controlling switching of operational states of a transistor component associated with the second reference resistor sub-component, based on a result of the comparing of the reduced supply voltage level to the reference voltage level, to facilitate controlling a bias current level associated with the amplifier component.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

BRIEF DESCRIPTION OF THE DRAWINGS

FIG. 6 illustrates a flow chart of an example method that can employ an enhanced current mirror that can desirably control a bias current associated with an amplifier component, in accordance with various aspects and embodiments of the disclosed subject matter.

FIG. 7 depicts a flow chart of another example method that can employ an enhanced current mirror that can desirably control a bias current associated with an amplifier component, in accordance with various aspects and embodiments of the disclosed subject matter.

DETAILED DESCRIPTION

Figure 1:
FIG. 1 illustrates a block diagram of a non-limiting example system that can comprise an enhanced current mirror that can desirably control a bias current associated with an amplifier, in accordance with various aspects and embodiments of the disclosed subject matter.

The disclosure herein is described with reference to the drawings, wherein like reference numerals are used to refer to like elements throughout. In the following description, for purposes of explanation, numerous specific details are set forth in order to provide a thorough understanding of the disclosed subject matter. It may be evident, however, that various disclosed aspects can be practiced without these specific details. In other instances, well-known structures and devices are shown in block diagram form in order to facilitate describing the disclosed subject matter.

Amplifier products can be used by different users (e.g., consumers) in different applications. The supply voltage available for an amplifier product in an electronic device also can vary. For example, a Gallium Arsenide (GaAs) pseudomorphic high-electron-mobility transistor (pHEMT) amplifier may be designed for a 6 volt (V) supply, but, depending on the electronic device in which the amplifier is used, the amplifier may be used with a 5V or 8V supply. In amplifier products (and certain other types of products), it can be desirable to have voltage supply independent current biasing. However, the differences in supply voltages provided by different types of voltage supply components and differences in amplifier designs, which can use different supply voltages (which can be different from the voltage supplied by a voltage supply component), can present various challenges with regard to achieving desirable (e.g., accurate and efficient) voltage supply independent current biasing.

In silicon-based designs, voltage regulators or current references can be used to provide voltage supply independent current biasing. However, in certain technologies, such as, for example, GaAs or Gallium Nitride (GaN) based technologies, where no complementary p-channel field-effect transistor (pFET) exists, it can be significantly more difficult to achieve or provide voltage supply independent current biasing. For instance, one challenge can be to design a self-bias circuit on the same GaAs or GaN die where the self-bias circuit can set and/or achieve a desirable (e.g., accurate, efficient, and/or optimal) bias current regardless of what the supply voltage of the voltage supply component is.

One basic approach to attempt to provide a self-bias circuit that can set an accurate bias current regardless of the supply voltage can be to use a voltage divider from voltage common collector ($V_{CC}$) (e.g., the highest supply rail) to negative supply voltage or voltage at ground ($V_{SS}$) (e.g., the lowest rail). However, this approach can have drawbacks. For instance, in this approach, the self-bias circuit can undesirably vary with process, temperature, and supply voltage.

Another approach to attempt to provide a self-bias circuit that can set an accurate bias current regardless of the supply voltage can be to use a current mirror. Because there is no pFET available (e.g., in certain technologies, such as, for example, GaAs or GaN based technologies), in this approach, in the self-bias circuit, a reference current can be created by a resistor connected to $V_{CC}$ (e.g., associated with the voltage supply), wherein the resistor can be situated between and associated with (e.g., electronically connected to) $V_{CC}$ at one terminal of the resistor and the amplifier at the other terminal of the resistor. This current mirror can remove most of the process and temperature variations. This current mirror can provide relatively reasonable results (e.g., +/−20% current variation) if the supply voltage is fixed and controlled (e.g., 5V+/−5%). As long as the reference current is accurate, the output current can be a direct multiple of the reference current. However, a drawback of this current mirror approach can be that the current mirror cannot remove the supply voltage variation. One issue can be that the voltage across the resistor of this current mirror can undesirably vary when $V_{CC}$ varies. For instance, as $V_{CC}$ increases (e.g., due to a higher supply voltage (e.g., 8V) being utilized), the voltage across the resistor can increase, and accordingly, the current through the resistor can correspondingly and undesirably increase. Another issue can be that the IDS current in an FET typically can undesirably increase when the $V_{DS}$ increases.

Other approaches to attempt to provide a self-bias circuit that can set an accurate bias current regardless of the supply voltage can relate to creating an internal current reference current. However, this can be quite difficult to accomplish without a pFET. Depletion-mode FET (DFET) current sources may be used, but DFET current sources can undesirably vary an undesirable large amount with process, voltage, and temperature (e.g., +/−50%, which can be significantly worse than a resistor variation).

In accordance with various embodiments, the disclosed subject matter can comprise an enhanced current mirror that can be utilized to desirably (e.g., accurately, efficiently, and/or optimally) control a bias current associated with an amplifier component. The disclosed subject matter can comprise a current controller component that can employ the enhanced current mirror and can be associated with (e.g., electronically or electrically connected to) the amplifier component. The current controller component can comprise a reference resistor component, a voltage adjuster component, and a comparator component. In some embodiments, the amplifier component can be or can comprise a GaAs pHEMT, GaN pHEMT, other type of pHEMT, or other desired type of amplifier component. In certain embodiments, the current controller component and the amplifier component can be situated on the same die (e.g., same integrated circuit die). In some embodiments, the amplifier component can comprise or can be an enhancement-mode field-effect transistor (EFET) or a DFET (e.g., a GaAs or GaN DFET).

The reference resistor component can comprise a first reference resistor sub-component having a first resistance value and a second reference resistor sub-component having a second resistance value, which can be same as or different from the first resistance value. The first reference resistor sub-component can be associated with the supply voltage, the second reference resistor sub-component, and the amplifier component. The second reference resistor sub-component can be associated with the amplifier component and the comparator component. The supply voltage can be supplied to the amplifier component and the current controller component (e.g., the reference resistor component and the voltage adjuster component of the current controller component). Depending on the application and/or device, the supply voltage can be one of various different supply voltages (e.g., provided by different types of voltage supply components) that can have different supply voltage levels (e.g., 4.0V, 5.0V, 6.0V, 7.0V, 8.0V, 9.0V, or other desired voltage).

The voltage adjuster component can desirably (e.g., suitably or optimally) adjust (e.g., reduce) the supply voltage level of the supply voltage to an adjusted supply voltage level. The voltage adjuster component can supply the adjusted supply voltage at the adjusted supply voltage level to the comparator component (e.g., to a gate of a transistor component of the comparator component).

The comparator component can compare the adjusted supply voltage level to a reference voltage level (e.g., a defined minimum threshold voltage level of the gate of the transistor component of the comparator component). The current controller component can control switching of an operational state (e.g., on state or off state) of the transistor component of the comparator component to switch in or out a resistance (e.g., the second reference resistor sub-component) of the reference resistor component, based at least in part on a result of the comparison of the adjusted supply voltage level to the reference voltage level, to facilitate accurately controlling an amount of bias current associated with the amplifier component. For instance, if the adjusted supply voltage level of the adjusted supply voltage applied to the gate of the transistor of the comparator component is less than the reference voltage level, the transistor component can be maintained in or switched to an off state to prevent a current associated with the supply voltage from flowing through the second reference resistor sub-component, wherein the current can flow through the first reference resistor sub-component to the amplifier component. If, instead, the adjusted supply voltage level of the adjusted supply voltage applied to the gate of the transistor of the comparator component is greater than or equal to the reference voltage level, the transistor component can be maintained in or switched to an on state to enable a second portion of a current associated with the supply voltage to flow through the second reference resistor sub-component, wherein a first portion of the current can flow through the first reference resistor sub-component to the amplifier component.

The disclosed subject matter, employing the current controller component and the enhanced current mirror, can desirably (e.g., suitably, accurately, efficiently, and/or optimally) control an amount of the bias current, based at least in part on the controlling of the resistance (e.g., controlling the switching in or out of the second reference resistor sub-component) of the reference resistor component, to satisfy a defined bias current accuracy criterion regardless of the supply voltage level of the supply voltage. Also, the disclosed subject matter, employing the current controller component and the enhanced current mirror, can desirably (e.g., suitably, efficiently, and/or optimally) mitigate (e.g., reduce or minimize) process variations, temperature variations, voltage variations, and/or current variations associated with the amplifier component.

These and other aspects and embodiments of the disclosed subject matter will now be described with respect to the drawings.

FIG. 1 illustrates a block diagram of a non-limiting example system 100 that can comprise an enhanced current mirror that can desirably (e.g., accurately, efficiently, enhanced, and/or optimally) control a bias current associated with an amplifier, in accordance with various aspects and embodiments of the disclosed subject matter. The system 100 can be part of, employed by, or associated with a device (e.g., an electronic device), which can be or can comprise an amplifier device that can receive input signals (e.g., electronic or electrical signals) and can amplify or otherwise process the input signals to generate output signals, wherein the amplifier device can have a gain that can range from unity to a desired gain that can be greater than unity (e.g., two times gain, three times gain, four times gain, or other desired gain). An amplifier can have a single stage or multiple stages (e.g., multiple gain stages).

An amplifier device can be utilized in a variety of different types of electronic devices, such as, for example, a communication device (e.g., a phone, a mobile phone, a computer, a laptop computer, an electronic pad or tablet, a television, an Internet Protocol television (IPTV), a set-top box, an electronic gaming device, electronic eyeglasses with communication functionality, an electronic watch with communication functionality, other electronic bodywear with communication functionality, or Internet of Things (IoT) devices), vehicle-related electronic devices, appliances (e.g., refrigerator, oven, microwave oven, washer, dryer, or other type of appliance), audio equipment (e.g., stereo system, radio system, or other type of audio equipment), musical equipment (e.g., electric or electronic musical instruments, instrument amplifier, audio signal processor, or other type of musical equipment), or other type of electronic device that can utilize amplifier devices to facilitate operation of the electronic device.

The system 100 can comprise an amplifier component 102 that can receive input signals and can amplify or otherwise process the input signals to generate output signals (e.g., amplified or increased gain output signals). The amplifier component 102 can comprise one or more transistor components (e.g., FET transistors or other type of transistor) and/or can have one or more gain stages. In some embodiments, the amplifier component 102 can be or can comprise a GaAs pHEMT, GaN pHEMT, other type of pHEMT, or other desired type of amplifier component. In some embodiments, the amplifier component can comprise or can be an EFET or a DFET, such as described herein. The amplifier component 102 can be designed to desirably (e.g., suitably or optimally) operate using a particular supply voltage level, such as, for example, 4.0V, 5.0V, 6.0V, 7.0V, 8.0V, 9.0V, or other desired supply voltage level, although the amplifier component 102 can operate using a supply voltage level that can range over or under the particular supply voltage level with regard to which the amplifier component 102 was designed. Different types of amplifier components can be designed to desirably operate at different supply voltage levels.

The amplifier component 102 can be associated with (e.g., directly or indirectly connected to) a voltage supply component 104 that can provide a desired supply voltage signal (e.g., $V_{CC}$), which can have a desired supply voltage level (e.g., 4.0V, 5.0V, 6.0V, 7.0V, 8.0V, 9V, or other desired supply voltage level), to provide voltage and/or power to the amplifier component 102 and/or other components or electronic circuitry of the system 100, such as described herein. There can be different types of voltage supply components that can provide different supply voltage levels.

In amplifier products (and certain other types of products), it can be desirable (e.g., wanted, useful, and/or beneficial) to have voltage supply independent current biasing. However, as disclosed, there can be differences in supply voltages provided by different types of voltage supply components (e.g., voltage supply component 104) and differences in amplifier designs, where different amplifier components can be designed to desirably operate using different supply voltages, and where the supply voltage at which an amplifier component (e.g., amplifier component 102) is designed can be different from the voltage supplied by a voltage supply component, and such differences can present various challenges with regard to achieving desirable (e.g., accurate, efficient, enhanced, and/or optimal) voltage supply independent current biasing. Further, GaAs pHEMT, GaN pHEMT, other type of pHEMT amplifiers can present additional problems in trying to achieve desirable voltage supply independent current biasing because there is no pFET available to use to facilitate providing desirable voltage supply independent current biasing. Existing techniques, approaches, and circuitry that attempt to provide voltage supply independent current biasing have a number of drawbacks and deficiencies, such as described herein.

In accordance with various embodiments, the disclosed subject matter (e.g., system 100) can comprise a current controller component 106 that can overcome the drawbacks and deficiencies of existing techniques, approaches, and circuitry, and can provide a desirable (e.g., accurate, efficient, enhanced, and/or optimal) self-bias circuit that can set or achieve an accurate bias current regardless of the supply voltage provided by a voltage supply component to the amplifier component 102 (or other type of electronic component). The current controller component 106 can comprise and/or employ an enhanced current mirror that can be utilized to desirably (e.g., accurately, efficiently, and/or optimally) control a bias current associated with the amplifier component 102 (or other type of electronic component). The current controller component 106 can be associated with (e.g., electronically connected to) the amplifier component 102. In certain embodiments, the current controller component 106 (including its constituent components, such as described herein), the amplifier component 102, and/or other components or electronic circuitry can be situated on the same die (e.g., same integrated circuit die).

In some embodiments, the current controller component 106 can comprise a reference resistor component 108, a voltage adjuster component 110, and a comparator component 112. In certain embodiments, the reference resistor component 108 can comprise a first reference resistor sub-component 114 and a second reference resistor sub-component 116. The input (e.g., input terminal) of the voltage adjuster component 110 and the first reference resistor sub-component 114 can be associated with (e.g., electronically connected to) the output of the voltage supply component 104, which can supply the supply voltage, at a supply voltage level, to the voltage adjuster component 110 and the first reference resistor component sub-component. In the electronic circuitry of the system 100, the first reference resistor sub-component 114 can be situated between, and associated with (e.g., electronically connected to), the voltage supply component 104 and an input (e.g., input terminal or port) of the amplifier component 102 such that the supply voltage can be supplied to the amplifier component 102 and a current can flow through the first reference resistor sub-component 114 where the current, or a portion thereof, can flow to the amplifier component 102, such as described herein.

An output (e.g., output terminal) of the voltage adjuster component 110 can be associated with (e.g., electronically connected to) an input of the comparator component 112 (e.g., associated with a gate terminal of a transistor component of the comparator component 112). In accordance with various embodiments, the voltage adjuster component 110 and the amplifier component 102 can be associated with (e.g., electronically connected to) a ground 118 or V$_{SS}$ 120, depending on whether an EFET or DFET is employed, such as more fully described herein. With regard to the amplifier component 102, a terminal(s) of the amplifier component 102 (e.g., one or more terminals (e.g., one or more terminals on the other side) of one or more transistor components of the amplifier component 102) can be associated with the ground 118.

With further regard to the comparator component 112, one of the terminals of the comparator component 112 (e.g., a terminal of the transistor component of the comparator component 112) can be associated with the ground 118. The second reference resistor sub-component 116 of the reference resistor component 108 can be associated with the first reference resistor sub-component 114 and the amplifier component 102 at one terminal of the second reference resistor sub-component 116, and the other terminal of the second reference resistor sub-component 116 can be associated with another terminal of the comparator component 112 (e.g., a terminal on the other side of the transistor component of the comparator component 112). In some embodiments, the first reference resistor sub-component 114 can have a resistance of 1.0 kiloOhms (kOhms), although, in other embodiments, the resistance can be greater than or less than 1.0 kOhms (e.g., the resistance can have a range of approximately 300 Ohms to approximately 5.0 kOhms). In certain embodiments, the second reference resistor sub-component 116 can have a resistance that can be of the same magnitude as the first reference resistor sub-component 114. For instance, the resistance of the second reference resistor sub-component 116 can be the same as, approximately the same as, the resistance of the first reference resistor sub-component 114 (e.g., a resistance of 1.0 kOhms, or another desired resistance in the range of approximately 300 Ohms to approximately 5.0 kOhms), although, in other embodiments, the resistance of the second reference resistor sub-component 116 can be different from the resistance of the first reference resistor sub-component 114. The respective resistances of the first reference resistor sub-component 114 and the second reference resistor sub-component 116 can be determined or selected based at least in part on the voltage level at which the amplifier component 102 has been designed, a range of supply voltage levels (e.g., a higher or highest supply voltage level, and a lower or lowest supply voltage level) that can be used with the amplifier component 102, and defined bias current accuracy criteria that can indicate or specify a desired (e.g., suitable, acceptable, and/or optimal) level of accuracy of bias currents associated with different supply voltage levels.

The current controller component 106 can desirably adjust (e.g., change or modify) the resistance of the reference resistor component 108 based at least in part on the supply voltage level supplied by the voltage supply component 104 to desirably (e.g., accurately, efficiently, enhanced, and/or optimally) control the amount of bias current (e.g., the bias or reference current level) associated with the amplifier component 102. For instance, based at least in part on the supply voltage level supplied by the voltage supply component 104, the current controller component 106 can switch (e.g., selectively switch) in or out the second reference resistor sub-component 116 to adjust the resistance of the reference resistor component 108, which can control the amount of current that flows to the amplifier component 102 to desirably control the amount of bias current (e.g., the bias or reference current level) associated with the amplifier component 102 (e.g., to maintain the bias current at a desired current level or within a desired current level range), in accordance with the defined bias current accuracy criteria, such as described herein.

In some embodiments, the voltage adjuster component 110 can desirably (e.g., suitably or optimally) adjust (e.g., reduce or modify) the supply voltage level (e.g., an amount of supply voltage) of the supply voltage of the voltage supply component 104 to a desired adjusted (e.g., reduced or modified) supply voltage level. For instance, when the supply voltage of the voltage supply component 104 is relatively low (e.g., 5.0V, 5.5V, 6.0V, or other relatively lower supply voltage level), the voltage adjuster component 110 can adjust or reduce the supply voltage level of the supply voltage by a sufficient amount to enable or ensure that the adjusted supply voltage level applied to the comparator component 112 (e.g., applied to the gate of the transistor component of the comparator component 112) can be less than a reference voltage level (e.g., a defined minimum threshold voltage level) associated with the comparator component 112. In accordance with various embodiments, the voltage adjuster component 110 can reduce the supply voltage level of the supply voltage level by a range of approximately 2.0V to 5.0V, although, in other embodiments, the voltage adjuster component 110 can reduce the supply voltage level by less than 2.0V or more than 5.0V, if and as desired (e.g., depending in part on the implementation, the voltage level used in the design of the amplifier, and/or the range of voltage levels that can be used for the supply voltage).

The comparator component 112 can compare the adjusted supply voltage level to the reference voltage level (e.g., the minimum threshold voltage level of the gate of the transistor component of the comparator component 112). The current controller component 106 can control switching of an operational state (e.g., on state or off state) of the transistor component of the comparator component 112 to switch in or out a resistance (e.g., the second reference resistor sub-component 116) of the reference resistor component 108, based at least in part on a result of the comparison of the adjusted supply voltage level to the reference voltage level, to facilitate accurately controlling an amount of bias current associated with the amplifier component 102. For instance, the comparator component 112 can compare the adjusted supply voltage level of the adjusted supply voltage to the reference threshold level. In this example case, since the supply voltage level can be relatively low, and, as a result, the adjusted supply voltage level can be less than the reference voltage level, the comparator component 112 can determine that the adjusted supply voltage level is less than the reference voltage level based at least in part on the result of comparing the adjusted supply voltage level to the reference voltage level. Based at least in part on such comparison result, the current controller component 106 can cause the second reference resistor sub-component 116 to not be connected to the ground 118 (e.g., the transistor component of the comparator component 112 can be switched or set to or maintained in an off state such that the second reference resistor sub-component 116 is not connected to the ground 118), which can prevent current associated with the supply voltage from flowing through the second reference resistor sub-component 116, and the current can flow through the first reference resistor sub-component 114 to the amplifier component 102. Since the supply voltage level can be relatively low, the amount of current flowing through the first reference resistor sub-component 114 to the amplifier component 102 can be at a desirable (e.g., suitable, acceptable, accurate, and/or optimal) current level. Accordingly, the current controller component 106 can control the resistance of the reference resistor component 108 to not switch in the second reference resistor sub-component 116 to change the resistance of the reference resistor component 108, since the amount of the current flowing to the amplifier component 102 is not undesirably high.

When the supply voltage of the voltage supply component 104 is relatively high (e.g., 7.0V, 7.5V, 8.0V, 8.5V, 9V, or other relatively higher supply voltage level), the voltage adjuster component 110 can adjust or reduce the supply voltage level of the supply voltage to a desired adjusted (e.g., reduced or modified) supply voltage level that can be lower than the supply voltage level. However, since the supply voltage level is relatively higher, the adjusted supply voltage level applied to the comparator component 112 (e.g., applied to the gate of the transistor component of the comparator component 112) can be greater than or equal to the reference voltage level (e.g., the defined minimum threshold voltage level) associated with the comparator component 112. The comparator component 112 can compare the adjusted supply voltage level of the adjusted supply voltage to the reference threshold level. In this example case, since the supply voltage level can be relatively higher, and, as a result, the adjusted supply voltage level can be greater than or equal to the reference voltage level, the comparator component 112 can determine that the adjusted supply voltage level is greater than or equal to the reference voltage level based at least in part on a result of comparing the adjusted supply voltage level to the reference voltage level. Based at least in part on such comparison result, the current controller component 106 can cause the second reference resistor sub-component 116 to be connected to the ground 118 (e.g., the transistor component of the comparator component 112 can be switched or set to or maintained in an on state such that a conductive path can be created to connect the second reference resistor sub-component 116 to the ground 118). That is, the current controller component 106 can switch in the second reference resistor sub-component 116 to change the resistance of the reference resistor component 108 and to operate in conjunction with the first reference resistor sub-component 114 with respect to the current and the amplifier component 102.

The current controller component 106, by switching in the second reference resistor sub-component 116, can cause or allow a portion (e.g., a second portion) of the current associated with the supply voltage to flow through the second reference resistor sub-component 116, where another portion (e.g., a first or reduced portion) of the current can flow from the first reference resistor sub-component 114 to the amplifier component 102. That is, when the supply voltage level is relatively higher, the adjusted supply voltage level can be relatively higher (but reduced to a lower voltage level than the supply voltage level), and, in response to the relatively higher adjusted supply voltage level, the current controller component 106 can switch in the second reference resistor sub-component 116, in conjunction with the first reference resistor sub-component 114, such that a desired portion (e.g., the second portion) of the current flowing from the first reference resistor sub-component 114 can be diverted from going to the amplifier component 102 and can instead flow through the second reference resistor sub-component 116 and the comparator component 112 (e.g., the transistor component of the comparator component 112) to the ground 118. As a result, the current controller component 106 can desirably reduce the amount of current (e.g., to the first portion or amount of current) flowing to the amplifier component 102 when the supply voltage of the voltage supply component 104 is relatively higher (e.g., 7.0V, 7.5V, 8.0V, 8.5V, 9V, or other relatively higher supply voltage level) and, accordingly, can desirably (e.g., accurately, suitably, enhanced, and/or optimally) control the bias current associated with the amplifier component 102, in accordance with (e.g., to satisfy; or meet or exceed) the defined bias current accuracy criteria. The first portion of the current associated with the relatively high supply voltage level can be the same amount of current as or approximately the same (e.g., sufficiently close to the same) amount of current as the amount of current that would be flowing to the amplifier component 102 when the supply voltage of the voltage supply component 104 is the relatively low supply voltage level, in accordance with the defined bias current accuracy criteria.

Thus, regardless of the supply voltage level of the supply voltage provided by a particular voltage supply component (e.g., voltage supply component 104), the current controller component 106 can desirably (e.g., accurately, suitably, enhanced, and/or optimally) control (e.g., manage) the bias current associated with the amplifier component 102. Further, employing the disclosed techniques, and the enhanced current mirror and associated circuitry (e.g., current controlling circuitry), the current controller component 106 can desirably (e.g., suitably, efficiently, and/or optimally) control and/or mitigate (e.g., reduce, minimize, eliminate, or substantially eliminate) process variations, temperature variations, voltage variations, and/or current variations associated with the amplifier component 102.

These and other aspect and embodiments of the disclosed subject matter will now be described with regard to the other drawings.

Figure 2:
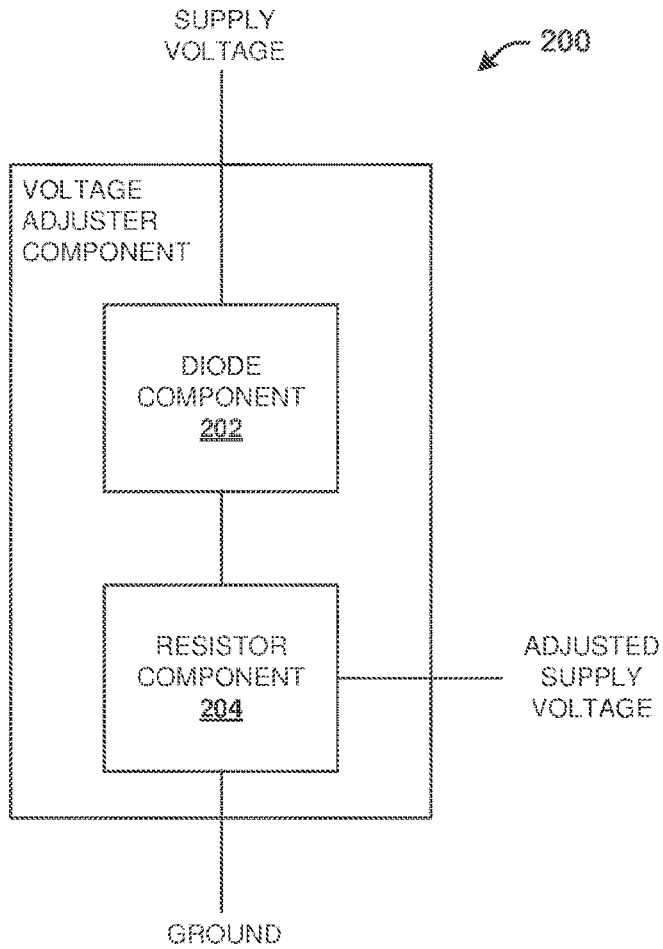
FIG. 2 depicts a non-limiting exemplary block diagram of a non-limiting example voltage adjuster component that can adjust a supply voltage level of a supply voltage applied to an electronic circuit, in accordance with various aspects and embodiments of the disclosed subject matter.

Referring to FIG. 2, FIG. 2 depicts a non-limiting exemplary block diagram of a non-limiting example voltage adjuster component 200 that can adjust a supply voltage level of a supply voltage applied to an electronic circuit, in accordance with various aspects and embodiments of the disclosed subject matter. The voltage adjuster component 200 can comprise, for example, a diode component 202 and a resistor component 204.

The voltage adjuster component 200 can receive a supply voltage at a supply voltage level from a voltage supply component, can adjust the supply voltage level to generate an adjusted supply voltage at an adjusted (e.g., reduced) supply voltage level, and can apply the adjusted supply voltage to the comparator component, such as described herein. In some embodiments, the diode component 202 can comprise a set (e.g., group) of diodes, which can be one or more diodes. When the set of diodes comprises two or more diodes, the diodes can be arranged in series with each other, with the output terminal of a first diode being associated with the input terminal of the second diode, and so on. Each diode of the set of diodes can reduce the voltage level of the supply voltage by a certain amount, wherein the amount the voltage level is reduced by each diode can be based at least in part on the characteristics of the diode. For instance, depending in part on the diode characteristics, each diode can reduce a voltage level of the supply voltage by approximately 1.2V or another voltage amount that can be less than or more than 1.2V. The diode component 202 can receive the supply voltage at the supply voltage level at the input of the diode component 202 and can output an initial (e.g., intermediate) adjusted supply voltage at an initial adjusted supply voltage level to the resistor component 204.

The resistor component 204 can comprise a set (e.g., group) of resistors (e.g., two resistors). In certain embodiments, one terminal of a first resistor of the resistor component 204 can be associated with (e.g., electronically connected to) the output of the diode component 202 and the other terminal of the first resistor can be associated with an input of the comparator component (e.g., gate terminal of the transistor component of the comparator component) and a terminal of a second resistor of the resistor component 204, wherein the other terminal of the second resistor can be associated with the ground. The resistor component 204 can receive the initial adjusted supply voltage at the initial adjusted supply voltage level and can further reduce the supply voltage by reducing the initial adjusted supply voltage level to the adjusted supply voltage level, based at least in part the arrangement of the resistors in relation to each other (e.g., resistors arranged to form a voltage divider circuit) and the respective resistance values of the resistors of the resistor component 204. In some embodiments, the resistors of the resistor component 204 can be utilized to desirably fine tune (e.g., at a more granular level than the diode component 202) the reduction of the voltage level of the supply voltage to achieve the desired adjusted voltage level of the adjusted supply voltage.

Figure 3:
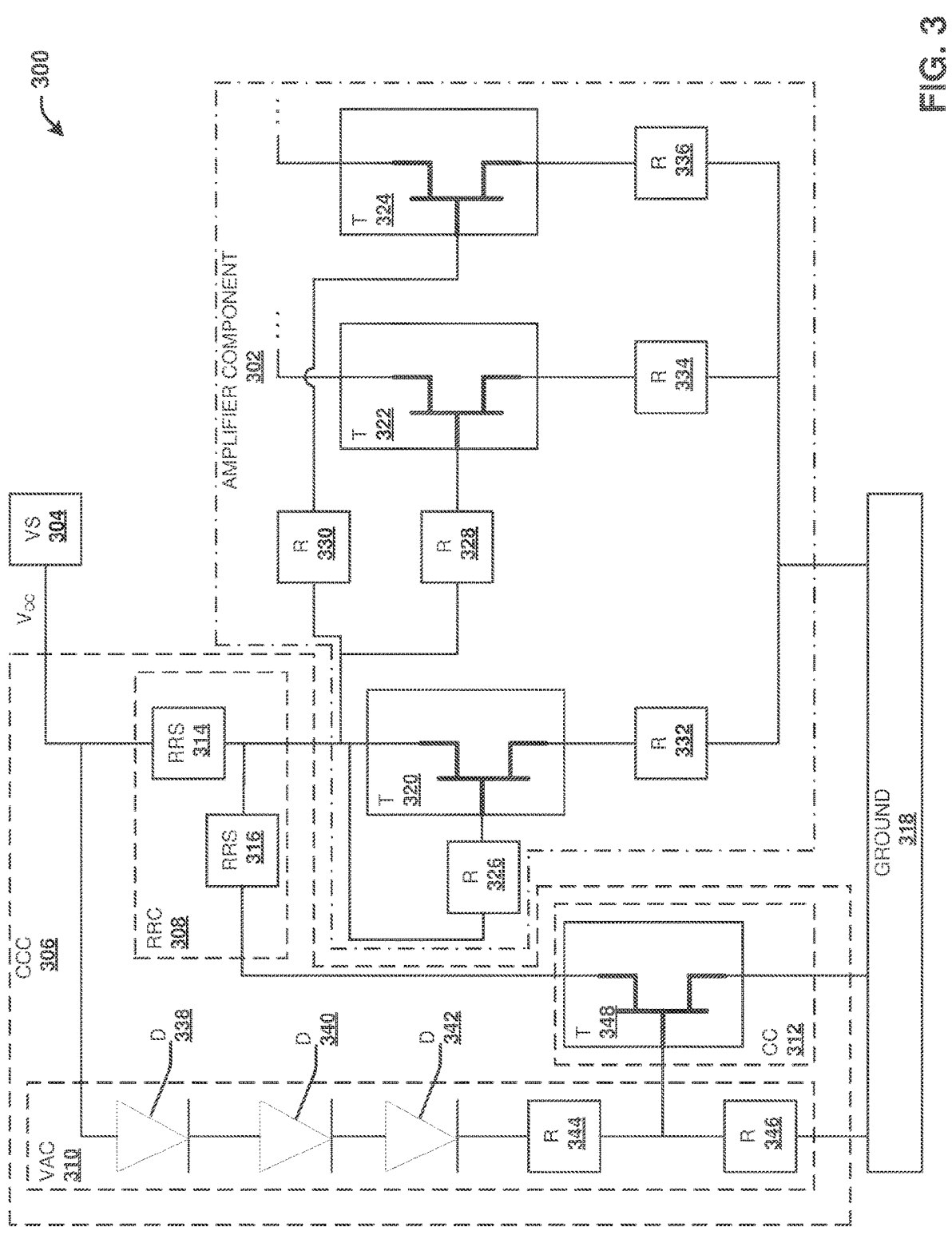
FIG. 3 illustrates a block diagram of a non-limiting exemplary system that can comprise an enhanced current mirror that can desirably control a bias current associated with an enhancement-mode field-effect transistor (EFET) amplifier, in accordance with various aspects and embodiments of the disclosed subject matter.

Referring to FIG. 3, FIG. 3 illustrates a block diagram of a non-limiting exemplary system 300 that can comprise an enhanced current mirror that can desirably (e.g., accurately, efficiently, enhanced, and/or optimally) control a bias current associated with an EFET amplifier, in accordance with various aspects and embodiments of the disclosed subject matter. The system 300 can comprise, for example, an amplifier component 302, a voltage supply component 304 (VS), a current controller component 306 (CCC), a reference resistor component 308 (RRC), a voltage adjuster component 310 (VAC), and a comparator component 312 (CC). For reasons of brevity and clarity, only some of the components of the amplifier component 302 are shown in FIG. 3 and described herein. The reference resistor component 308 can comprise a first reference resistor sub-component 314 and a second reference resistor sub-component 316. The amplifier component 302, voltage adjuster component 310, and comparator component 312 can be associated with a ground 318. The amplifier component 302, voltage supply component 304, current controller component 306, reference resistor component 308, voltage adjuster component 310, and comparator component 312 can be same as or similar to, and/or can comprise the same or similar functionality and features as, respective components (e.g., respectively named components), such as more fully described herein. The amplifier component 302, voltage supply component 304, current controller component 306, reference resistor component 308, including the first reference resistor sub-component 314 (RRS 314) and second reference resistor sub-component 316 (RRS 316), voltage adjuster component 310, comparator component 312, and the ground 318 can be respectively arranged in relation to each other in an electronic circuit and/or can be respectively associated with (e.g., electronically connected to) respective other components of the system 300, such as more fully described herein (e.g., with regard to the system 100) and as shown in FIG. 3.

The current controller component 306 can be associated with (e.g., electronically connected to) the amplifier component 302. In certain embodiments, the current controller component 306 (including its constituent components, such as described herein), the amplifier component 302, and/or other components or electronic circuitry can be situated on the same die (e.g., same integrated circuit die).

The amplifier component 302 can comprise a set of transistor components, such as, for example, transistor components 320, 322, and/or 324 (T) that can facilitate ampli-
fying or otherwise processing an input signal (e.g., elec-
tronic signal) received at the input of the amplifier
component 302 to generate an amplified or otherwise pro-
cessed signal at the output of the amplifier component 302.
In some embodiments, the set of transistor components (e.g.,
320, 322, and/or 324) can be FETs, although, in other
embodiments, the set of transistor components can be a
different type of transistor. The respective transistor com-
ponents of the set of transistor components (e.g., 320, 322,
and/or 324) can have respective threshold voltage levels
(e.g., minimum threshold voltage levels) associated with
their respective gates to facilitate switching the respective
transistor components between an off state and on state. In
certain embodiments, some of the set of transistor compo-
nents (e.g., 322 and/or 324) can provide a desired amount of
gain (e.g., 8 times (8×) gain or other desired amount of gain
less than or greater than 8×) to amplify the input signal.

The gates of the transistor components of the set of
transistor components (e.g., 320, 322, and/or 324) can be
associated with respective resistor components, such as
resistor components 326, 328, and/or 330 (R), wherein the
respective resistor components (e.g., 326, 328, and/or 330)
can be associated with the reference resistor component 308
(e.g., can be electronically connected to the same node as the
first reference resistor sub-component 314 and second ref-
erence resistor sub-component 316, as well as a terminal
(e.g., drain terminal) of the transistor component 320). In
some embodiments, the resistor component 326 can have a
resistance of 16 kOhms, although in other embodiments, the
resistor component 326 can have a resistance that can be
greater than or less than 16 kOhms, if and as desired. In
certain embodiments, the resistor components 328 and 330
each can have a resistance of 2 kOhms, although in other
embodiments, the resistor components 328 and/or 330 can
have a resistance that can be greater than or less than 2
kOhms, if and as desired. Respective terminals (e.g., respec-
tive source terminals) of the transistor components of the set
of transistor components (e.g., 320, 322, and/or 324) can be
associated with (e.g., electronically connected to terminals
of) respective resistor components, such as resistor compo-
nents 332, 334, and/or 336, which can be associated with the
ground 318 (e.g., the other terminals of the resistor compo-
nents 332, 334, and/or 336 can be electronically connected
to the ground 318). In some embodiments, the resistor
component 332 can have a resistance of 20 Ohms, although
in other embodiments, the resistor component 332 can have
a resistance that can be greater than or less than 20 Ohms,
if and as desired. In certain embodiments, the resistor
components 334 and 336 each can have a resistance of 2.5
Ohms, although in other embodiments, the resistor compo-
nents 334 and/or 336 can have a resistance that can be
greater than or less than 2.5 Ohms, if and as desired.

The voltage adjuster component 310 can comprise a set of
diode components, such as diode components 338, 340,
and/or 342, and a set of resistor components, such as resistor
components 344 and/or 346. The diode component 338 can
be associated with the voltage supply component 304,
wherein the supply voltage (e.g., $V_{CC}$) can be supplied to the
diode component 338. The set of diode components (D)
(e.g., 338, 340, and/or 342) can reduce the supply voltage
level of the supply voltage to an initial adjusted supply
voltage level (e.g., of an initial adjusted supply voltage),
which can be supplied to the resistor component 344, such
as described herein. The resistor components 344 and 346
can further reduce or process the initial adjusted supply
voltage to generate the adjusted supply voltage at the desired adjusted supply voltage level, such as described herein. In
some embodiments, the resistor component 344 can have a
resistance that can be based at least in part on (e.g., can be
determined, selected, or set as a function of) the first
reference resistor sub-component 314. For instance, the
resistor component 344 can have a resistance that can be
approximately five times (or more than five times) greater
than the amount of resistance of the first reference resistor
sub-component 314, although, in other embodiments, the
resistance of the resistor component 344 can be less than five
times the amount of resistance of the first reference resistor
sub-component 314. For example, if the first reference
resistor sub-component 314 has a resistance of 1.0 kOhms,
the resistor component 344 can have a resistance of 5.0
kOhms (or greater or less than 5.0 kOhms, if desired). In
certain embodiments, the resistor component 346 can have
a resistance that can correspond to (e.g., can be of the same
magnitude as) the resistance of resistor component 344. For
instance, the resistor component 346 can have a resistance
that can be the same as, or approximately the same as, the
amount of resistance of the resistor component 344,
although, in other embodiments, the resistance of the resistor
component 346 can be greater than or less than the resistance
of the resistor component 344. The resistor components 344
and 346 of the voltage adjuster component 310 can supply
the adjusted supply voltage at the adjusted supply voltage
level to the gate of a transistor component 348 of the
comparator component 312.

The transistor component 348 can have a defined thresh-
old gate voltage level (e.g., minimum threshold voltage
level) for switching the transistor component 348 between
the off state and the on state, wherein the defined threshold
gate voltage level can be the reference voltage level
employed by the comparator component 312. One terminal
(e.g., drain terminal) of the transistor component 348 can be
associated with the second reference resistor sub-component
316, and the other terminal (e.g., source terminal) of the
transistor component 348 can be associated with the ground
318.

The current controller component 306 can desirably
adjust (e.g., change or modify) the resistance of the refer-
ence resistor component 308, for example, by switching the
second reference resistor sub-component 316 in or out,
based at least in part on the supply voltage level supplied by
the voltage supply component 304 to desirably (e.g., accu-
rately, efficiently, enhanced, and/or optimally) control the
amount of bias current (e.g., the bias or reference current
level) associated with the amplifier component 302, such as
described herein. For instance, if the adjusted (e.g., reduced)
supply voltage level applied to the gate of the transistor
component 348 is less than the reference voltage level (e.g.,
the defined minimum threshold voltage level associated with
the gate of the transistor component 348), the transistor
component 348 can be switched to or maintained in the off
state to have the reference resistance comprise the first
reference resistor sub-component 314, and the second ref-
erence resistor sub-component 316 can be switched out,
which can prevent current associated with the supply voltage
from flowing through the second reference resistor sub-
component 316 to the ground 318. That is, with the transistor
component 348 being in the off state, the second reference
resistor sub-component 316 associated with (e.g., electroni-
cally connected to) the transistor component 348 can be
disconnected from the ground 318. As a result, the current
can flow from the first reference resistor sub-component 314
to the amplifier component 302 without any portion of the current being diverted from the amplifier component 302 to or through the second reference resistor sub-component 316.

If, instead, the adjusted supply voltage level is greater than or equal to the reference voltage level, the transistor component 348 can be switched to or maintained in the on state to switch in the second reference resistor sub-component 316 and change the reference resistance by having the reference resistance comprise the first reference resistor sub-component 314 and second reference resistor sub-component 316. This can divert a portion of the current associated with the supply voltage through the second reference resistor sub-component 316 to the ground 318. That is, with the transistor component 348 being in the on state, the second reference resistor sub-component 316 associated with the transistor component 348 can be connected to the ground 318 via the transistor component 348. As a result, a second portion of the current flowing from the first reference resistor sub-component 314 can be diverted away from the amplifier component 302 and can instead flow from the first reference resistor sub-component 314 through the second reference resistor sub-component 316 to the ground 318, and a first portion (e.g., a desirably reduced portion) of the current can flow to the amplifier component 302.

Figure 4:
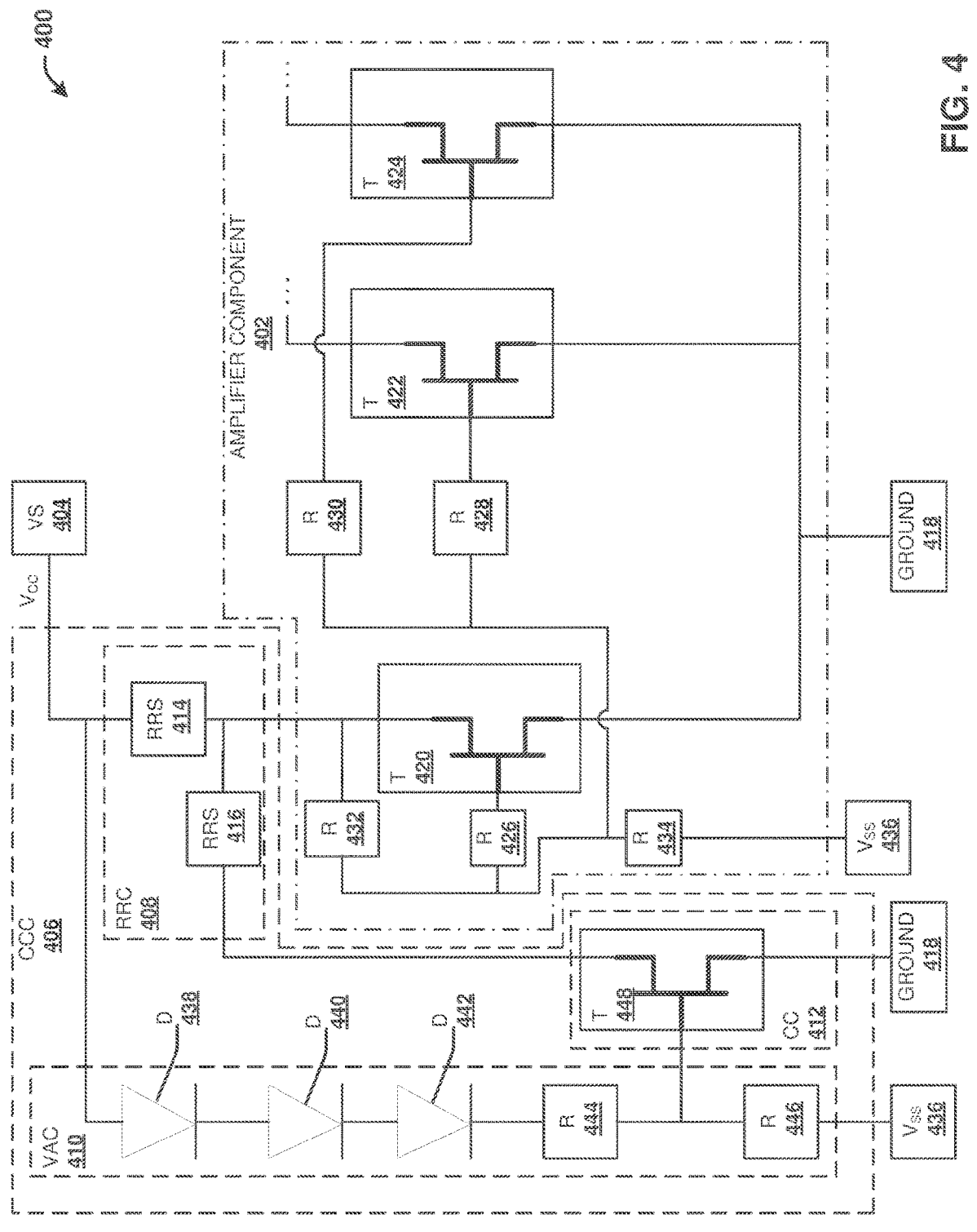
FIG. 4 presents a block diagram of a non-limiting exemplary system that can comprise an enhanced current mirror that can desirably control a bias current associated with a depletion-mode field-effect transistor (DFET) amplifier, in accordance with various aspects and embodiments of the disclosed subject matter.

Referring to FIG. 4, FIG. 4 presents a block diagram of a non-limiting exemplary system 400 that can comprise an enhanced current mirror that can desirably (e.g., accurately, efficiently, enhanced, and/or optimally) control a bias current associated with a DFET amplifier, in accordance with various aspects and embodiments of the disclosed subject matter. The system 400 can comprise, for example, an amplifier component 402, a voltage supply component 404, a current controller component 406, a reference resistor component 408, a voltage adjuster component 410, and a comparator component 412. For reasons of brevity and clarity, only some of the components of the amplifier component 402 are shown in FIG. 4 and described herein. The reference resistor component 408 can comprise a first reference resistor sub-component 414 (RRS 414) and a second reference resistor sub-component 416 (RRS 416). The amplifier component 402, voltage adjuster component 410, and comparator component 412 can be associated with a ground 418. The amplifier component 402, voltage supply component 404, current controller component 406, reference resistor component 408, voltage adjuster component 410, and comparator component 412 can be same as or similar to, and/or can comprise the same or similar functionality and features as, respective components (e.g., respectively named components), such as more fully described herein. The amplifier component 402, voltage supply component 404, current controller component 406, reference resistor component 408, including the first reference resistor sub-component 414 and second reference resistor sub-component 416, voltage adjuster component 410, comparator component 412, and the ground 418 can be respectively arranged in relation to each other in an electronic circuit and/or can be respectively associated with (e.g., electronically connected to) respective other components of the system 400, such as more fully described herein (e.g., with regard to the system 100) and as shown in FIG. 4.

The current controller component 406 can be associated with (e.g., electronically connected to) the amplifier component 402. In certain embodiments, the current controller component 406 (including its constituent components, such as described herein), the amplifier component 402, and/or other components or electronic circuitry can be situated on the same die (e.g., same integrated circuit die).

The amplifier component 402 can comprise a set of transistor components, such as, for example, transistor components 420, 422, and/or 424 that can facilitate amplifying or otherwise processing an input signal (e.g., electronic signal) received at the input of the amplifier component 402 to generate an amplified or otherwise processed signal at the output of the amplifier component 402. In some embodiments, the set of transistor components (e.g., 420, 422, and/or 424) can be FETs, although, in other embodiments, the set of transistor components can be a different type of transistor. The respective transistor components of the set of transistor components (e.g., 420, 422, and/or 424) can have respective threshold voltage levels (e.g., minimum threshold voltage levels) associated with their respective gates to facilitate switching the respective transistor components between an off state and on state. In certain embodiments, some of the set of transistor components (e.g., 422 and/or 424) can provide a desired amount of gain (e.g., 8 times (8×) gain or other desired amount of gain less than or greater than 8×) to amplify the input signal.

The gates of the transistor components of the set of transistor components (e.g., 420, 422, and/or 424) can be associated with respective resistor components, such as resistor components 426, 428, and/or 430, wherein the respective resistor components (e.g., 426, 428, and/or 430) can be associated with (e.g., electronically connected to) a pair of resistor components 432 and 434 at a node situated between resistor component 432 and resistor component 434. The resistor component 432 can be associated with (e.g., electronically connected to) the first reference resistor sub-component 414 and a terminal (e.g., drain terminal) of the transistor component 420, as well as being associated with the second reference resistor sub-component 416. The resistor component 434, at its other terminal (e.g., the terminal not connected to the resistor components 426, 428, 430, and 432), can be connected to $V_{SS}$ 436, which can be a negative supply voltage that typically can be at a desired negative voltage level. In some embodiments, the resistor component 426 can have a resistance of 16 kOhms, although in other embodiments, the resistor component 426 can have a resistance that can be greater than or less than 16 kOhms, if and as desired. In certain embodiments, the resistor components 428 and 430 each can have a resistance of 2 kOhms, although in other embodiments, the resistor components 428 and/or 430 can have a resistance that can be greater than or less than 2 kOhms, if and as desired. Respective terminals (e.g., respective source terminals) of the transistor components of the set of transistor components (e.g., 420, 422, and/or 424) can be associated with (e.g., electronically connected to) the ground 418. The resistor components 432 and/or 434 can have a resistance that can be based at least in part on the first reference resistor sub-component 414. For instance, the resistor component 432 can have a resistance that can be approximately five times (or more than five times) greater than the amount of resistance of the first reference resistor sub-component 414, although, in other embodiments, the resistance can be less than five times the amount of resistance of the first reference resistor sub-component 414. As an example, if the first reference resistor sub-component 414 has a resistance of 1.0 kOhms, the resistor component 432 can have a resistance of 5.0 kOhms (or greater or less than 5.0 kOhms, if desired). In certain embodiments, the resistor component 434 can have a resistance that can correspond to (e.g., can be of the same magnitude as) the resistance of resistor component 432. For example, the resistor component 434 can have a resistance that can be the same as, or approximately the same as, the amount of resistance of the resistor component 432, although, in other embodiments, the resistance of the resistor component 434 can be greater than or less than the resistance of the resistor component 432, if desired.

The voltage adjuster component 410 can comprise a set of diode components, such as diode components 438, 440, and/or 442, and a set of resistor components, such as resistor components 444 and/or 446. The diode component 438 can be associated with the voltage supply component 404, wherein the supply voltage (e.g., $V_{CC}$) can be supplied to the diode component 438. The set of diode components (e.g., 438, 440, and/or 442) can reduce the supply voltage level of the supply voltage to an initial adjusted supply voltage level (e.g., of an initial adjusted supply voltage), which can be supplied to the resistor component 444, such as described herein. A terminal of the resistor component 444 can be associated with the output terminal of diode component 442, and the other terminal of the resistor component 444 can be associated with a terminal of the resistor component 446 and a gate of a transistor component 448 of the comparator component 412. The other terminal of the resistor component 446 can be connected to $V_{SS}$ 436. The resistor components 444 and 446 can further reduce or process the initial adjusted supply voltage to generate the adjusted supply voltage at the desired adjusted supply voltage level, such as described herein. In some embodiments, the resistor component 444 can have a resistance that can be based at least in part on the first reference resistor sub-component 414. For instance, the resistor component 444 can have a resistance that can be approximately five times (or more than five times) greater than the amount of resistance of the first reference resistor sub-component 414, although, in other embodiments, the resistance can be less than five times the amount of resistance of the first reference resistor sub-component 414. As an example, if the first reference resistor sub-component 414 has a resistance of 1.0 kOhms, the resistor component 444 can have a resistance of 5.0 kOhms (or greater or less than 5.0 kOhms, if desired). In certain embodiments, the resistor component 446 can have a resistance that can correspond to (e.g., can be of the same magnitude as) the resistance of the resistor component 444. For example, the resistor component 446 can have a resistance that can be the same as, or approximately the same as, the amount of resistance of the resistor component 444, although, in other embodiments, the resistance of the resistor component 446 can be greater than or less than the resistance of the resistor component 444, if desired. The resistor components 444 and 446 of the voltage adjuster component 410 can supply the adjusted supply voltage at the adjusted supply voltage level to the gate of a transistor component 448.

The transistor component 448 can have a defined threshold gate voltage level (e.g., defined minimum threshold voltage level) for switching the transistor component 448 between the off state and the on state, wherein the defined threshold gate voltage level can be the reference voltage level employed by the comparator component 412. One terminal (e.g., drain terminal) of the transistor component 448 can be associated with the second reference resistor sub-component 416, and the other terminal (e.g., source terminal) of the transistor component 448 can be associated with the ground 418. Since this is a DFET, the defined threshold voltage level of the gate of the transistor component 448 typically can be a negative voltage level, such as, for example, at or approximately −1.0V or other desired negative voltage level. The adjusted supply voltage level can be sufficiently low enough to be below the threshold voltage level when a relatively lower supply voltage (e.g., 5V or other relatively lower supply voltage) is utilized in the circuit for the amplifier component 402, where the transistor component 448 can be in an off state when the adjusted supply voltage level is below the threshold voltage level of the gate of the transistor component 448. When the supply voltage level utilized in the circuit for the amplifier component 402 is a relatively higher voltage level (e.g., 8V or higher), the adjusted supply voltage level can be sufficiently high enough (e.g., at or above 0V) to be at or above the defined threshold voltage level associated with the gate of the transistor component 448, where the transistor component 448 can be in an on state when the adjusted supply voltage level is at or above the threshold voltage level of the gate of the transistor component 448.

The current controller component 406 can desirably adjust (e.g., change or modify) the resistance of the reference resistor component 408, for example, by switching the second reference resistor sub-component 416 in or out, based at least in part on the supply voltage level supplied by the voltage supply component 404 to desirably (e.g., accurately, efficiently, enhanced, and/or optimally) control the amount of bias current associated with the amplifier component 402, such as described herein. For instance, if the adjusted (e.g., reduced) supply voltage level applied to the gate of the transistor component 448 is less than the reference voltage level (e.g., the defined minimum threshold voltage level associated with the gate of the transistor component 448), the transistor component 448 can be switched to or maintained in the off state to have the reference resistance comprise the first reference resistor sub-component 414, and the second reference resistor sub-component 416 can be switched out, which can prevent current associated with the supply voltage from flowing through the second reference resistor sub-component 416 to the ground 418. That is, with the transistor component 448 being in the off state, the second reference resistor sub-component 416 associated with (e.g., electronically connected to) the transistor component 448 can be disconnected from the ground 418. As a result, the current can flow from the first reference resistor sub-component 414 to the amplifier component 402 without any portion of the current being diverted from the amplifier component 402 to or through the second reference resistor sub-component 416.

If, instead, the adjusted supply voltage level is greater than or equal to the reference voltage level, the transistor component 448 can be switched to or maintained in the on state to switch in the second reference resistor sub-component 416 and change the reference resistance by having the reference resistance comprise the first reference resistor sub-component 414 and second reference resistor sub-component 416. By engaging the second reference resistor sub-component 416, this can divert a portion of the current associated with the supply voltage through the second reference resistor sub-component 416 to the ground 418. That is, with the transistor component 448 being in the on state, the second reference resistor sub-component 416 associated with the transistor component 448 can be connected to the ground 418 via the transistor component 448. As a result, a second portion of the current flowing from the first reference resistor sub-component 414 can be diverted away from the amplifier component 402 and can instead flow from the first reference resistor sub-component 414 through the second reference resistor sub-component 416 to the ground 418, and a first portion (e.g., a desirably reduced portion) of the current can flow to the amplifier component 402.

Figure 5:
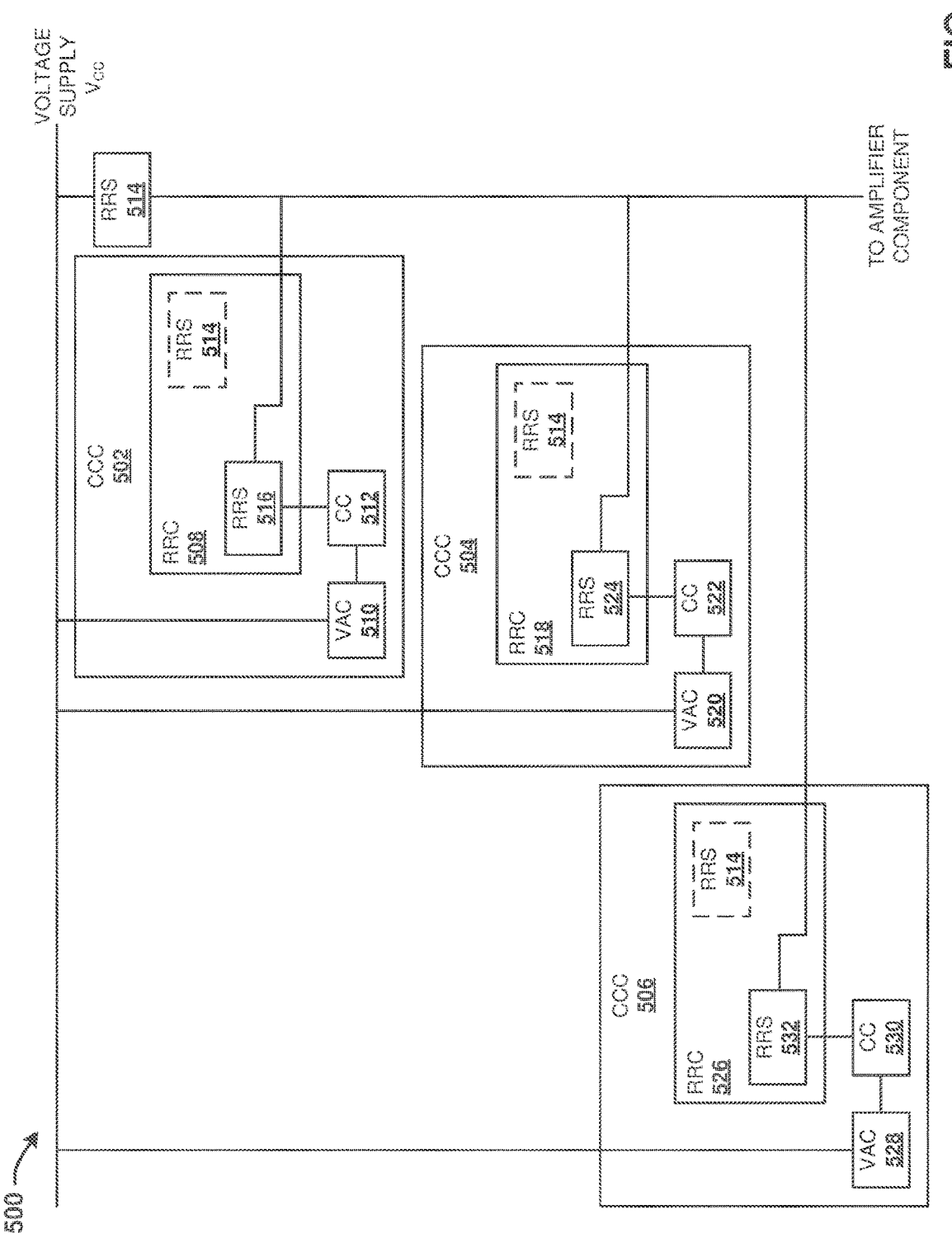
FIG. 5 illustrates a block diagram of a non-limiting exemplary current controller component that can change a resistance associated with a supply voltage by switching in or out respective reference resistors based on respective supply voltage levels to facilitate desirably controlling a bias current associated with an amplifier, in accordance with various aspects and embodiments of the disclosed subject matter.

Turning to FIG. 5, FIG. 5 illustrates a block diagram of a non-limiting exemplary current controller component 500 that can change a resistance associated with a supply voltage by switching in or out respective reference resistors based on respective supply voltage levels to facilitate desirably (e.g., accurately, efficiently, enhanced, and/or optimally) controlling a bias current associated with an amplifier, in accordance with various aspects and embodiments of the disclosed subject matter. The current controller component 500 can comprise, for example, a group (e.g., N) of current controller sub-components, such as current controller sub-component 502, current controller sub-component 504, and/or current controller sub-component 506, that can be utilized to switch in or out different reference resistor sub-components, depending in part on what the supply voltage level is, to facilitate desirably controlling the bias current associated with an amplifier, wherein N can be virtually any desired number.

In some embodiments, the current controller sub-component 502 can comprise a reference resistor component 508, a voltage adjuster component 510, and a comparator component 512. The reference resistor component 508 can comprise a reference resistor sub-component 514 (e.g., a first reference resistor sub-component) of a desired resistance and a reference resistor sub-component 516 (e.g., a second reference resistor sub-component) having a desired first resistance. The current controller sub-component 502, including its constituent components, can be configured to be employed (e.g., engaged) when supply voltage from a first voltage supply component is at a first supply voltage level (e.g., 8V or another desired voltage). The first resistance of the reference resistor sub-component 516 can be determined and selected based at least in part on the first supply voltage level and the resistance of the reference resistor sub-component 514 to facilitate desirably (e.g., accurately, efficiently, and/or optimally) controlling the bias current, for example, by switching in the first resistance of the reference resistor sub-component 516 (in combination with the reference resistor sub-component 514) to change the resistance if and when the first voltage supply component is utilized to provide the first supply voltage at the first supply voltage level to the amplifier component.

The voltage adjuster component 510 can reduce the supply voltage level of the supply voltage by a desired amount to a first adjusted supply voltage level, such as described herein. The first adjusted supply voltage level can be sufficiently reduced from the supply voltage level such that, when a relatively lower supply voltage (e.g., 5V, 6V, or other relatively lower supply voltage) is utilized, the gate voltage applied to the gate of the transistor component (not shown in FIG. 5) of the comparator component 512 can be low enough to be below the defined threshold gate voltage (e.g., defined minimum threshold gate voltage, or reference voltage level) of the transistor component to switch the transistor component to or maintain it in an off state; and when the first supply voltage (e.g., 8V) or other relatively higher supply voltage (e.g., above 8V) is utilized, the gate voltage applied to the gate of the transistor component of the comparator component 512 can be high enough to be at or above the defined threshold gate voltage of the transistor component of the comparator component 512 to switch that transistor component to or maintain it in an on state. Accordingly, when the relatively lower supply voltage is utilized, the reference resistor sub-component 516 can be switched out or off (e.g., can be disconnected from the ground), because the transistor component of the comparator component 512 can be switched off, to prevent current from the reference resistor sub-component 514 from flowing through the reference resistor sub-component 516, and, when the first supply voltage or other higher supply voltage is utilized, the reference resistor sub-component 516 can be switched in or on (e.g., can be connected to the ground) to add in the first resistance of the reference resistor sub-component 516, because the transistor component of the comparator component 512 can be switched on, to divert a portion of current flowing from the reference resistor sub-component 514 to and through the reference resistor sub-component 516 to reduce the amount of current flowing to the amplifier component to facilitate desirably (e.g., accurately, efficiently, and/or optimally) controlling the bias current associated with the amplifier component.

The current controller sub-component 504 can comprise a reference resistor component 518, a voltage adjuster component 520, and a comparator component 522. The reference resistor component 518 can comprise the reference resistor sub-component 514 (e.g., the first reference resistor sub-component) and a reference resistor sub-component 524 (e.g., another second reference resistor sub-component) having a desired second resistance. The current controller sub-component 504, including its constituent components, can be configured to be employed when supply voltage from a second voltage supply component is at a second supply voltage level (e.g., 10V or another desired relatively higher voltage that is higher than the first supply voltage level). The second resistance of the reference resistor sub-component 524 can be determined and selected based at least in part on the second supply voltage level, the resistance of the reference resistor sub-component 514, and/or the first resistance of the reference resistor sub-component 516 to facilitate desirably (e.g., accurately, efficiently, and/or optimally) controlling the bias current, for example, by switching in the second resistance of the reference resistor sub-component 524 (in combination with the reference resistor sub-component 514 and reference resistor sub-component 516) to change the resistance if and when the second voltage supply component is utilized to provide the second supply voltage at the second supply voltage level to the amplifier component.

The voltage adjuster component 520 can desirably reduce the supply voltage level of the supply voltage by a desired amount to produce a second adjusted supply voltage at a second adjusted supply voltage level, such as described herein. The voltage adjuster component 520 can adjust the supply voltage level to produce the second adjusted supply voltage level such that the second adjusted supply voltage level typically can be lower than the first adjusted supply voltage level produced by the voltage adjuster component 510. For instance, the second adjusted supply voltage level can be sufficiently reduced from the supply voltage level such that, when a relatively lower supply voltage (e.g., 5V, 6V, or other relatively lower supply voltage) or even the first supply voltage (e.g., 8V) is utilized, the gate voltage applied to the gate of the transistor component (not shown in FIG. 5) of the comparator component 522 can be low enough to be below the defined threshold gate voltage (e.g., defined minimum threshold gate voltage, or reference voltage level) of the transistor component of the comparator component 522 to switch that transistor component to or maintain it in an off state; and when the second supply voltage (e.g., 10V) or other relatively higher supply voltage (e.g., above 10V) is utilized, the gate voltage applied to the gate of the transistor component of the comparator component 522 can be high enough to be at or above the defined threshold gate voltage of that transistor component to switch that transistor component to or maintain it in an on state. Accordingly, when the relatively lower supply voltage or the first supply voltage is utilized, the reference resistor sub-component 524 can be switched out or off (e.g., can be disconnected from the ground), because the transistor component of the comparator component 522 can be switched off, to prevent current from the reference resistor sub-component 514 from flowing through the reference resistor sub-component 524, and, when the second supply voltage or other higher supply voltage is utilized, the reference resistor sub-component 524 (and the reference resistor sub-component 516) can be switched in or on (e.g., can be connected to the ground) to add in the second resistance of the reference resistor sub-component 524, because the transistor component of the comparator component 522 (and because the transistor component of the comparator component 512) can be switched on, to divert a portion of current flowing from the reference resistor sub-component 514 to and through the reference resistor sub-component 524 (and the reference resistor sub-component 516) to reduce the amount of current flowing to the amplifier component. This can facilitate desirably (e.g., accurately, efficiently, and/or optimally) controlling the bias current associated with the amplifier component. The amount of current diverted through the combination of the reference resistor sub-component 524 and the reference resistor sub-component 516 in this example scenario can desirably be greater than the amount of current that can be diverted through the reference resistor sub-component 516 in the example scenario when the first supply voltage has been employed in the circuit for the amplifier component.

The current controller sub-component 506 can comprise a reference resistor component 526, a voltage adjuster component 528, and a comparator component 530. The reference resistor component 526 can comprise the reference resistor sub-component 514 (e.g., the first reference resistor sub-component) and a reference resistor sub-component 532 (e.g., still another second reference resistor sub-component) having a desired third resistance. The current controller sub-component 506, including its constituent components, can be configured to be employed when supply voltage from a third voltage supply component is at a third supply voltage level (e.g., 12V or another desired voltage that can be higher than the first supply voltage level and second supply voltage level). The third resistance of the reference resistor sub-component 532 can be determined and selected based at least in part on the third supply voltage level, the resistance of the reference resistor sub-component 514, the reference resistor sub-component 516, and/or the reference resistor sub-component 524 to facilitate desirably (e.g., accurately, efficiently, and/or optimally) controlling the bias current, for example, by switching in the third resistance of the reference resistor sub-component 532 (in combination with the reference resistor sub-component 514 and the reference resistor sub-component 524) to change the resistance if and when the third voltage supply component is utilized to provide the third supply voltage at the third supply voltage level to the amplifier component.

The voltage adjuster component 528 can desirably reduce the supply voltage level of the supply voltage by a desired amount to produce a third adjusted supply voltage at a third adjusted supply voltage level, such as described herein. For instance, the voltage adjuster component 528 can adjust the supply voltage level to produce the third adjusted supply voltage level such that the third adjusted supply voltage level typically can be lower than the second adjusted supply voltage level produced by the voltage adjuster component 520 and the first adjusted supply voltage level produced by the voltage adjuster component 510. The third adjusted supply voltage level can be sufficiently reduced from the supply voltage level such that, when a relatively lower supply voltage (e.g., 5V, 6V, or other relatively lower supply voltage) or even the first supply voltage (e.g., 8V) or second supply voltage (e.g., 10V) is utilized, the gate voltage applied to the gate of the transistor component (not shown in FIG. 5) of the comparator component 530 can be low enough to be below the defined threshold gate voltage (e.g., defined minimum threshold gate voltage, or reference voltage level) of the transistor component of the comparator component 530 to switch that transistor component to or maintain it in an off state; and when the second supply voltage (e.g., 12V) or other relatively higher supply voltage (e.g., above 12V) is utilized, the gate voltage applied to the gate of the transistor component of the comparator component 530 can be high enough to be at or above the defined threshold gate voltage of that transistor component to switch that transistor component to or maintain it in an on state. Accordingly, when the relatively lower supply voltage or the first or second supply voltage is utilized, the reference resistor sub-component 532 can be switched out or off (e.g., can be disconnected from the ground), because the transistor component of the comparator component 530 can be switched off, to prevent current from the reference resistor sub-component 514 from flowing through the reference resistor sub-component 532, and, when the third supply voltage or other higher supply voltage is utilized, the reference resistor sub-component 532 (and the reference resistor sub-component 516 and reference resistor sub-component 524) can be switched in or on (e.g., can be connected to the ground) to add in the third resistance of the reference resistor sub-component 532, because the transistor component of the comparator component 530 (and because the transistor component of the comparator component 512 and the transistor component of the comparator component 522) can be switched on, to divert a desired portion of current flowing from the reference resistor sub-component 514 to and through the reference resistor sub-component 532 (and the reference resistor sub-component 516 and the reference resistor sub-component 524) to desirably reduce the amount of current flowing to the amplifier component. This can facilitate desirably (e.g., accurately, efficiently, and/or optimally) controlling the bias current associated with the amplifier component. The amount of current diverted through the combination of the reference resistor sub-component 532, reference resistor sub-component 524, and reference resistor sub-component 516 in this example scenario can desirably be greater than the amount of current that can be diverted through the reference resistor sub-component 516 in the example first scenario when the first supply voltage has been employed in the circuit for the amplifier component and can desirably be greater than the amount of current that can be diverted through the reference resistor sub-component 516 and reference resistor sub-component 524 in the example second scenario when the second supply voltage has been employed in the circuit for the amplifier component.

It is noted that the respective comparator components (e.g., 512, 522, and 530) can be connected to ground, and the respective voltage adjuster components (e.g., 510, 528, and 528) can be connected to ground of $V_{SS}$, depending on whether EFET or DFET is employed. For reasons of brevity and clarity, such connections to ground or $V_{SS}$ are not shown in FIG. 5.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

In view of the example systems and/or devices described herein, example methods that can be implemented in accordance with the disclosed subject matter can be further appreciated with reference to flowcharts in FIGS. 6-7. For purposes of simplicity of explanation, example methods disclosed herein are presented and described as a series of acts; however, it is to be understood and appreciated that the disclosed subject matter is not limited by the order of acts, as some acts may occur in different orders and/or concurrently with other acts from that shown and described herein. For example, a method disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a method in accordance with the subject specification. It should be further appreciated that the methods disclosed throughout the subject specification are capable of being stored on an article of manufacture to facilitate transporting and transferring such methods to computers for execution by a processor or for storage in a memory.

FIG. 6 illustrates a flow chart of an example method 600 that can employ an enhanced current mirror that can desirably (e.g., accurately, efficiently, enhanced, and/or optimally) control a bias current associated with an amplifier component, in accordance with various aspects and embodiments of the disclosed subject matter. The method 600 can be employed by, for example, a system comprising the current controller component and an amplifier component associated with the current controller component, which can comprise a voltage adjuster component, a comparator component, and a reference resistor component that can comprise a first reference resistor sub-component and a second reference resistor sub-component.

At 602, a reduced supply voltage level can be compared to a reference voltage level, wherein the reduced supply voltage level can be derived from a supply voltage level of a supply voltage that can be supplied to an amplifier component, wherein a reference resistor component can comprise a first reference resistor sub-component and a second reference resistor sub-component, and wherein the first reference resistor sub-component can be associated with the supply voltage, the second reference resistor sub-component, and at least a first transistor component of the amplifier component.

The current controller component can comprise the reference resistor component, voltage adjuster component, and comparator component, and can be associated with the amplifier component. The voltage adjuster component can adjust the supply voltage to reduce the supply voltage level to the reduced supply voltage level. The comparator component can compare the reduced supply voltage level to the reference voltage level (e.g., the minimum threshold voltage level associated with the gate of the transistor component of the comparator component).

At 604, switching of operational states of a transistor component (e.g., of a comparator component) associated with the second reference resistor sub-component can be controlled, based at least in part on a result of the comparing of the reduced supply voltage level to the reference voltage level, to facilitate controlling a bias current level associated with the amplifier component. The current controller component can control switching of the operational states of the transistor component of the comparator component, based at least in part on the result of the comparing of the reduced supply voltage level to the reference voltage level, to facilitate controlling the bias current level associated with the amplifier component.

For instance, if the comparison result indicates that the reduced supply voltage level is less than the reference voltage level, this can indicate that the supply voltage level is relatively low, and, accordingly, the transistor component can be switched to or maintained in an off state, which can switch out the second reference resistor sub-component (e.g., keep the second reference resistor sub-component from being connected to the ground, and prevent current associated with the supply voltage from flowing through the second reference resistor sub-component to the ground). If the comparison result indicates that the reduced supply voltage level is greater than or equal to the reference voltage level, this can indicate that the supply voltage level is relatively high, and, accordingly, the transistor component can be switched to or maintained in an on state, which can switch in the second reference resistor sub-component and adjust the resistance of the reference resistor component. Switching the transistor component to the on state can connect the second reference resistor sub-component to the ground, which can allow a portion (e.g., second portion) of the current associated with the supply voltage to flow through the second reference resistor sub-component to the ground. This can reduce the amount of current (e.g., reduce to a first portion of current) that flows from the first reference resistor sub-component to the amplifier component.

FIG. 7 depicts a flow chart of another example method 700 that can employ an enhanced current mirror that can desirably (e.g., accurately, efficiently, enhanced, and/or optimally) control a bias current associated with an amplifier component, in accordance with various aspects and embodiments of the disclosed subject matter. The method 700 can be employed by, for example, a system comprising the current controller component and an amplifier component associated with the current controller component, which can comprise a voltage adjuster component, a comparator component, and a reference resistor component that can comprise a first reference resistor sub-component and a second reference resistor sub-component.

At 702, a supply voltage level of a supply voltage supplied to an amplifier component can be reduced to generate a reduced supply voltage at a reduced supply voltage level. The supply voltage can be applied to the amplifier component. A current can be produced through the first reference resistor sub-component that can be situated between and associated with (e.g., electronically connected to) the voltage supply component and the amplifier component. The current controller component can comprise a voltage adjuster component that can adjust the supply voltage level of the supply voltage to generate the reduced supply voltage at the reduced supply voltage level.

At 704, the reduced supply voltage level can be compared to a reference voltage level. The comparator component can compare the reduced supply voltage level of the reduced supply voltage to the reference voltage level (e.g., the minimum threshold voltage level associated with a gate of the transistor component of the comparator component).

At 706, a determination can be made regarding whether the reduced supply voltage is less than the reference voltage level. The comparator component can determine whether the reduced supply voltage is less than the reference voltage level based at least in part on a result of the comparison of the reduced supply voltage level to the reference voltage level.

If the reduced supply voltage level is determined to be less than the reference voltage level, at 708, the transistor component can be switched to or maintained in the off state to have the reference resistance comprise the first reference resistor sub-component and have the second reference resistor sub-component switched out or off, which can prevent current associated with the supply voltage from flowing through the second reference resistor sub-component to the ground. If the reduced supply voltage level is less than the reference voltage level, the transistor component can be switched to or maintained in the off state. As a result, the second reference resistor sub-component associated with the transistor component can be disconnected from the ground, and accordingly, current can flow from the first reference resistor sub-component to the amplifier component without any portion of the current being diverted from the amplifier component to the second reference resistor sub-component.

Referring again to reference numeral 706, if, instead, at 706, the reduced supply voltage level is determined to not be less than (e.g., determined to be greater than or equal to; meet or exceed; or satisfy) the reference voltage level, at 710, the transistor component can be switched to or maintained in the on state to switch in the second reference resistor sub-component and have the reference resistance comprise the first reference resistor sub-component and second reference resistor sub-component, which can divert a portion of the current associated with the supply voltage through the second reference resistor sub-component to the ground. If the reduced supply voltage level is greater than or equal to the reference voltage level, the transistor component can be switched to or maintained in the on state. As a result, the second reference resistor sub-component associated with the transistor component can be connected to the ground via the transistor component, and accordingly, a second portion of the current can be diverted away from the amplifier component and can flow from the first reference resistor sub-component through the second reference resistor sub-component, and a first portion (e.g., a desirably reduced portion) of the current can flow to the amplifier component.

Reference throughout this specification to "one embodiment," "an embodiment," "an example", "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one example," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like can refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, or other component) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips, or other type of magnetic storage device), optical disks (e.g., compact disk (CD), digital versatile disk (DVD), or other type of optical disk), smart cards, and flash memory devices (e.g., card, stick, key drive, or other type of flash memory device). Computer-readable transport media can include carrier waves, or the like. Of course, those skilled in the art will recognize many modifications can be made to this configuration without departing from the scope or spirit of the disclosed subject matter.

What has been described above includes examples of the disclosed subject matter. It is, of course, not possible to describe every conceivable combination of components or methods for purposes of describing the disclosed subject matter, but one of ordinary skill in the art can recognize that many further combinations and permutations of the disclosed subject matter are possible. Accordingly, the disclosed subject matter is intended to embrace all such altera-
tions, modifications and variations that fall within the spirit
and scope of the disclosure. Furthermore, to the extent that
a term "includes", "including", "has" or "having" and vari-
ants thereof is used in either the detailed description or the
claims, such term is intended to be inclusive in a manner
similar to the term "comprising" as "comprising" is inter-
preted when employed as a transitional word in a claim.

Moreover, the word "exemplary" is used herein to mean
serving as an example, instance, or illustration. Any aspect
or design described herein as "exemplary" is not necessarily
to be construed as preferred or advantageous over other
aspects or designs. Rather, use of the word exemplary is
intended to present concepts in a concrete fashion. As used
in this application, the term "or" is intended to mean an
inclusive "or" rather than an exclusive "or". That is, unless
specified otherwise, or clear from context, "X employs A or
B" is intended to mean any of the natural inclusive permu-
tations. That is, if X employs A; X employs B; or X employs
both A and B, then "X employs A or B" is satisfied under any
of the foregoing instances. In addition, the articles "a" and
"an" as used in this application and the appended claims
should generally be construed to mean "one or more" unless
specified otherwise or clear from context to be directed to a
singular form.

It has proven convenient, principally for reasons of com-
mon usage, to refer to these signals as bits, values, elements,
symbols, characters, terms, numbers, or the like. It should be
borne in mind, however, that all of these and similar terms
are to be associated with the appropriate physical quantities
and are merely convenient labels applied to these quantities.
Unless specifically stated otherwise or apparent from the
foregoing discussion, it is appreciated that throughout the
disclosed subject matter, discussions utilizing terms such as
processing, computing, calculating, determining, or display-
ing, and the like, refer to the action and processes of
processing systems, and/or similar consumer or industrial
electronic devices or machines, that manipulate or transform
data represented as physical (electrical and/or electronic)
quantities within the registers or memories of the electronic
device(s), into other data similarly represented as physical
quantities within the machine and/or computer system
memories or registers or other such information storage,
transmission and/or display devices.

In regard to the various functions performed by the above
described components, architectures, circuits, processes and
the like, the terms (including a reference to a "means") used
to describe such components are intended to correspond,
unless otherwise indicated, to any component which per-
forms the specified function of the described component
(e.g., a functional equivalent), even though not structurally
equivalent to the disclosed structure, which performs the
function in the herein illustrated exemplary aspects of the
embodiments. In addition, while a particular feature may
have been disclosed with respect to only one of several
implementations, such feature may be combined with one or
more other features of the other implementations as may be
desired and advantageous for any given or particular appli-
cation. It will also be recognized that the embodiments
include a system as well as a computer-readable medium
having computer-executable instructions for performing the
acts and/or events of the various processes.

What is claimed is:

1. A device configured to facilitate control of bias current,
comprising:
   a comparator component that compares an adjusted sup-
      ply voltage level to a reference voltage level of a gate of a first transistor component of the comparator com-
ponent, wherein the adjusted supply voltage level
relates to a supply voltage level of a supply voltage that
is supplied to an amplifier component, and wherein at
least one of a source and a drain of the first transistor
component is directly connected with ground; and
a current controller component that controls a resistance
of a reference resistor component associated with the
supply voltage, based on a result of the comparison of
the adjusted supply voltage level to the reference
voltage level, to facilitate controlling an amount of the
bias current associated with the amplifier component.

2. The device of claim 1, wherein the current controller
component controls the amount of the bias current, at least
based on the controlling of the resistance of the reference
resistor component, to satisfy a defined bias current accuracy
criterion regardless of the supply voltage level of the supply
voltage, and wherein the current controller component miti-
gates at least one of: process variations, temperature varia-
tions, voltage variations, and current variations associated
with the device.

3. The device of claim 1, wherein the reference resistor
component comprises a first reference resistor sub-compo-
nent and a second reference resistor sub-component,
wherein the first reference resistor sub-component is asso-
ciated with the supply voltage, the second reference resistor
sub-component, and a second transistor component of the
amplifier component, and
   wherein the second reference resistor sub-component is
      associated with the second transistor component of the
      amplifier component and the first transistor component
      of the comparator component.

4. The device of claim 3, wherein the current controller
component comprises the comparator component and the
reference resistor component, wherein an adjusted supply
voltage having the adjusted supply voltage level is applied
to the gate of the first transistor component of the compara-
tor component,
   wherein, in response to the adjusted supply voltage level
      of the adjusted supply voltage applied to the gate being
      less than the reference voltage level associated with the
      first transistor component, the first transistor compo-
      nent is maintained in or switched to an off state to
      prevent a current associated with the supply voltage
      from flowing through the second reference resistor
      sub-component, and wherein the current flows through
      the first reference resistor sub-component to the ampli-
      fier component.

5. The device of claim 3, wherein the current controller
component comprises the comparator component and the
reference resistor component, wherein an adjusted supply
voltage having the adjusted supply voltage level is applied
to the gate of the first transistor component of the compara-
tor component,
   wherein, in response to the adjusted supply voltage level
      of the adjusted supply voltage applied to the gate being
      greater than or equal to the reference voltage level
      associated with the first transistor component, the first
      transistor component is maintained in or switched to an
      on state to enable a second portion of a current asso-
      ciated with the supply voltage to flow through the
      second reference resistor sub-component, and wherein
      a first portion of the current flows from the first
      reference resistor sub-component to the amplifier com-
      ponent.

6. The device of claim 5, wherein a second resistance
value of the second reference resistor sub-component is based on a first resistance value of the first reference resistor sub-component and a range of supply voltage levels of supply voltages that are able to be supplied to the device.

7. The device of claim 1, further comprising:
a voltage adjuster component that reduces the supply voltage level of the supply voltage down to the adjusted supply voltage level, wherein the voltage adjuster component is associated with the supply voltage and the comparator component.

8. The device of claim 7, wherein the voltage adjuster component comprises a set of diodes and a set of resistors that are arranged in relation to each other to reduce the supply voltage level of the supply voltage to the adjusted supply voltage level.

9. The device of claim 7, wherein the current controller component comprises the comparator component, the reference resistor component, and the voltage adjuster component, and wherein the current controller component is on a same die as the amplifier component.

10. The device of claim 1, wherein the amplifier component comprises an enhancement-mode field-effect transistor or a depletion-mode field-effect transistor.

11. A system that facilitates management of reference current, comprising:
a comparator component that compares a modified supply voltage level to a reference voltage level of a gate of a first transistor component of the comparator component, wherein the modified supply voltage level is based on a supply voltage level of a supply voltage that is provided to an amplifier component, and wherein at least one of a source and a drain of the first transistor component is directly connected with ground; and
a current controller component that manages a resistance of a reference resistor component associated with the supply voltage, based on a result of the comparison of the modified supply voltage level to the reference voltage level, to facilitate managing a reference current level of the reference current associated with the amplifier component.

12. The system of claim 11, wherein the current controller component is configured to manage the reference current level, at least based on the management of the resistance of the reference resistor component, to satisfy a defined reference current accuracy criterion over a range of different supply voltage levels of different supply voltages, wherein the different supply voltage levels of the different supply voltages comprise the supply voltage level of the supply voltage, and wherein the current controller component mitigates at least one of process variations, temperature variations, voltage variations, or current variations associated with the system.

13. The system of claim 11, wherein the reference resistor component comprises a first reference resistor sub-component and a second reference resistor sub-component, wherein the first reference resistor sub-component is associated with the supply voltage, the second reference resistor sub-component, and a second transistor component of the amplifier component, and
wherein the second reference resistor sub-component is associated with the second transistor component of the amplifier component and the first transistor component of the comparator component.

14. The system of claim 13, wherein the current controller component comprises the comparator component and the reference resistor component, wherein a modified supply voltage having the modified supply voltage level is supplied to the gate of the first transistor component of the comparator component,
wherein, in response to the modified supply voltage level being less than the reference voltage level associated with the first transistor component, the first transistor component is set in or switched to an off state to prevent a current associated with the supply voltage from flowing through the second reference resistor sub-component, and wherein the current flows through the first reference resistor sub-component to the amplifier component.

15. The system of claim 13, wherein the current controller component comprises the comparator component and the reference resistor component, wherein a modified supply voltage having the modified supply voltage level is supplied to the gate of the first transistor component of the comparator component,
wherein, in response to the modified supply voltage level being greater than or equal to the reference voltage level associated with the first transistor component, the first transistor component is set in or switched to an on state to facilitate a second portion of a current associated with the supply voltage flowing through the second reference resistor sub-component, and wherein a first portion of the current flows from the first reference resistor sub-component to the amplifier component.

16. The system of claim 11, further comprising:
a voltage modifier component that modifies the supply voltage level of the supply voltage to the modified supply voltage level, wherein the voltage modifier component is associated with the supply voltage and the comparator component.

17. The system of claim 16, wherein the current controller component comprises the comparator component, the reference resistor component, and the voltage modifier component, and wherein the current controller component is on a same die as the amplifier component.

18. The system of claim 11, wherein the amplifier component comprises an enhancement-mode field-effect transistor or a depletion-mode field-effect transistor.

19. A method that facilitates controlling bias current, comprising:
comparing a reduced supply voltage level to a reference voltage level of a gate of a first transistor component of a comparator component, wherein the reduced supply voltage level is derived from a supply voltage level of a supply voltage that is supplied to an amplifier component, wherein at least one of a source and a drain of the first transistor component is directly connected to ground, wherein a reference resistor component comprises a first reference resistor sub-component and a second reference resistor sub-component, and wherein the first reference resistor sub-component is associated with the supply voltage, the second reference resistor sub-component, and a second transistor component of the amplifier component; and
controlling switching of operational states of the first transistor component associated with the second reference resistor sub-component, based on a result of the comparing of the reduced supply voltage level to the reference voltage level, to facilitate controlling a bias current level of the bias current associated with the amplifier component.

20. The method of claim 19, further comprising:
supplying a reduced supply voltage having the reduced supply voltage level to the gate of the first transistor component that facilitates the comparing, wherein the controlling of the switching of the operational states of the first transistor component associated with the second reference resistor sub-component comprises:

in response to the reduced supply voltage level being less than the reference voltage level associated with the first transistor component, controlling the switching of the first transistor component to place the first transistor component in an off state to prevent a current associated with the supply voltage from flowing through the second reference resistor sub-component, wherein the current flows through the first reference resistor sub-component to the amplifier component; or in response to the reduced supply voltage level being greater than or equal to the reference voltage level associated with the first transistor component, controlling the switching of the first transistor component to place the first transistor component in an on state to enable a second portion of the current associated with the supply voltage to flow through the second reference resistor sub-component, wherein a first portion of the current flows from the first reference resistor sub-component to the amplifier component.

\* \* \* \* \*